(12) United States Patent
Kang et al.

(10) Patent No.: US 12,402,430 B2
(45) Date of Patent: Aug. 26, 2025

(54) IMAGE SENSOR

(71) Applicant: SAMSUNG ELECTRONICS CO., LTD., Suwon-si (KR)

(72) Inventors: Seung Kuk Kang, Seoul (KR); Min Ho Jang, Suwon-si (KR); Hoon Joo Na, Seoul (KR); Hee Ju Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 658 days.

(21) Appl. No.: 17/573,826

(22) Filed: Jan. 12, 2022

(65) Prior Publication Data

US 2022/0375983 A1    Nov. 24, 2022

(30) Foreign Application Priority Data

May 18, 2021  (KR) .................. 10-2021-0063803

(51) Int. Cl.
    *H10F 39/00*     (2025.01)
    *H04N 25/79*     (2023.01)
(52) U.S. Cl.
    CPC ....... *H10F 39/811* (2025.01); *H10F 39/8063* (2025.01); *H10F 39/809* (2025.01); *H04N 25/79* (2023.01)
(58) Field of Classification Search
    CPC ..... H01L 277/14636; H01L 277/14627; H01L 27/14636; H01L 27/14627; H01L 27/1463; H10F 39/8063; H10F 39/811; H10F 39/199; H10F 39/807
    See application file for complete search history.

(56) References Cited

U.S. PATENT DOCUMENTS 8,928,784 B2  1/2015  Watanabe et al.
10,672,818 B2  6/2020  Tanaka et al.
(Continued)

FOREIGN PATENT DOCUMENTS

| JP | 2017216480 A | 12/2017 |
|---|---|---|
| JP | 2020191334 A | 11/2020 |
| KR | 1020200078480 A | 7/2020 |

*Primary Examiner* — Samuel A Gebremariam
*Assistant Examiner* — Jonas T Beardsley
(74) *Attorney, Agent, or Firm* — Sughrue Mion, PLLC

(57) ABSTRACT

An image sensor is provided. The image sensor includes unit pixels inside the substrate; a pixel separation pattern provided between the unit pixels, inside the substrate; a first inter-wiring insulating film provided on the first surface of the substrate; a pad pattern provided inside the first inter-wiring insulating film; a first connection pattern provided inside the first inter-wiring insulating film, an upper surface of the first connection pattern and an upper surface of the first inter-wiring insulating film being provided along a first common plane; a second inter-wiring insulating film provided on the upper surface of the first inter-wiring insulating film; a second connection pattern provided inside the second inter-wiring insulating film, a lower surface of the second connection pattern and a lower surface of the second inter-wiring insulating film being provided along a second common plane; and a microlens provided on the second surface of the substrate. The first connection pattern is provided in an island shape from a planar viewpoint.

18 Claims, 28 Drawing Sheets

(56) References Cited

U.S. PATENT DOCUMENTS

| | | | |
|---|---|---|---|
| 2015/0076649 A1* | 3/2015 | Kim | ................. H01L 27/14634 |
| | | | 257/446 |
| 2016/0119562 A1* | 4/2016 | Takase | ................... H04N 25/75 |
| | | | 348/312 |
| 2020/0219924 A1 | 7/2020 | Hayashi | |

* cited by examiner

IMAGE SENSOR

CROSS-REFERENCE TO RELATED APPLICATION

This application claims priority from Korean Patent Application No. 10-2021-0063803 filed on May 18, 2021 in the Korean Intellectual Property Office, the disclosure of which is herein incorporated by reference in its entirety.

BACKGROUND

1. Field

Methods, apparatuses and systems consistent with example embodiments relate to an image sensor.

2. Related Art

An image sensor is a semiconductor element that converts optical information into electric signals. Such an image sensor may include a charge coupled device (CCD) image sensor, and a complementary metal-oxide semiconductor (CMOS) image sensor.

The image sensor may be configured in the form of a package, and the package may be configured as a structure that protects the image sensor and allows light to enter a photo receiving surface or a sensing area of the image sensor.

Recently, a backside illumination (BSI) image sensor, in which incident light is radiated through a back side of a semiconductor substrate so that pixels formed in the image sensor have improved light-receiving efficiency and light sensitivity is being studied.

SUMMARY

One or more example embodiments provide an image sensor having improved quality and productivity.

However, aspects of the present disclosure are not restricted to the examples set forth herein. Aspects of the present disclosure will become more apparent to one of ordinary skill in the art to which the present disclosure pertains by referencing the detailed description below.

According to an aspect of an example embodiment, there is provided an image sensor including: a substrate which has a first surface and a second surface that are opposite to each other; a plurality of unit pixels, each of which includes a photoelectric conversion layer, inside the substrate; a pixel separation pattern provided between the plurality of the unit pixels, inside the substrate; a first inter-wiring insulating film provided on the first surface of the substrate; a pad pattern provided inside the first inter-wiring insulating film; a first connection pattern provided inside the first inter-wiring insulating film, an upper surface of the first connection pattern and an upper surface of the first inter-wiring insulating film being provided along a first common plane; a second inter-wiring insulating film provided on the upper surface of the first inter-wiring insulating film; a second connection pattern provided inside the second inter-wiring insulating film, a lower surface of the second connection pattern and a lower surface of the second inter-wiring insulating film being provided along a second common plane; and a microlens provided on the second surface of the substrate. The first connection pattern is provided in an island shape from a planar viewpoint.

According to an aspect of an example embodiment, there is provided an image sensor including: a substrate which has a first surface and a second surface that are opposite to each other, a first region, and a second region around the first region; a plurality of unit pixels, each of which includes a photoelectric conversion layer, inside the substrate; a pixel separation pattern provided between the plurality of unit pixels, inside the substrate; a first inter-wiring insulating film provided on the first surface of the substrate; a pad pattern provided in a grid shape from a planar viewpoint, inside the first inter-wiring insulating film, in the first region; a first connection pattern which is provided inside the first inter-wiring insulating film, an upper surface of the first connection pattern and an upper surface of the first inter-wiring insulating film being provided along a first common plane; a second inter-wiring insulating film provided on the upper surface of the first inter-wiring insulating film; a second connection pattern which is provided inside the second inter-wiring insulating film, a lower surface of the second connection pattern and a lower surface of the second inter-wiring insulating film being provided along a second common plane; and a microlens provided on the second surface of the substrate, in the first region. The first connection pattern does not overlap the pad pattern in a first direction, in the first region, and the second connection pattern overlaps the pad pattern and the first connection pattern in the first direction, in the first region.

According to an aspect of an example embodiment, there is provided an image sensor including: a substrate which has a first surface and a second surface that are opposite to each other; a plurality of unit pixels, each of which includes a photoelectric conversion layer, inside the substrate; a pixel separation pattern provided between the plurality of the unit pixels, inside the substrate; a first inter-wiring insulating film which is provided on the first surface of the substrate, and includes a first bonding insulating film which defines an upper surface of the first inter-wiring insulating film; a pad pattern provided in a grid shape from a planar viewpoint, inside the first inter-wiring insulating film; a first connection pattern which is provided in an island shape from the planar viewpoint, inside the first inter-wiring insulating film and penetrates the first bonding insulating film, an upper surface of the first connection pattern and the upper surface of the first inter-wiring insulating film being provided along a first common plane; a second inter-wiring insulating film which is provided on the upper surface of the first inter-wiring insulating film, and includes a second bonding insulating film that defines a lower surface of the second inter-wiring insulating film; a second connection pattern which is provided inside the second inter-wiring insulating film and penetrates the second bonding insulating film, a lower surface of the second connection pattern and the lower surface of the second inter-wiring insulating film being provided along a second common plane; and a microlens provided on the second surface of the substrate. The first connection pattern and the pad pattern do not overlap in a first direction, the second connection pattern extends in a second direction that intersects the first direction, and the upper surface of the first inter-wiring insulating film and the lower surface of the second inter-wiring insulating film are in contact with each other.

BRIEF DESCRIPTION OF THE DRAWINGS

The above and other aspects, features and advantages will become more apparent from the following description taken in conjunction with the attached drawings, in which.

DETAILED DESCRIPTION

Example embodiments will be described more fully with reference to the accompanying drawings.

Figure 1A:
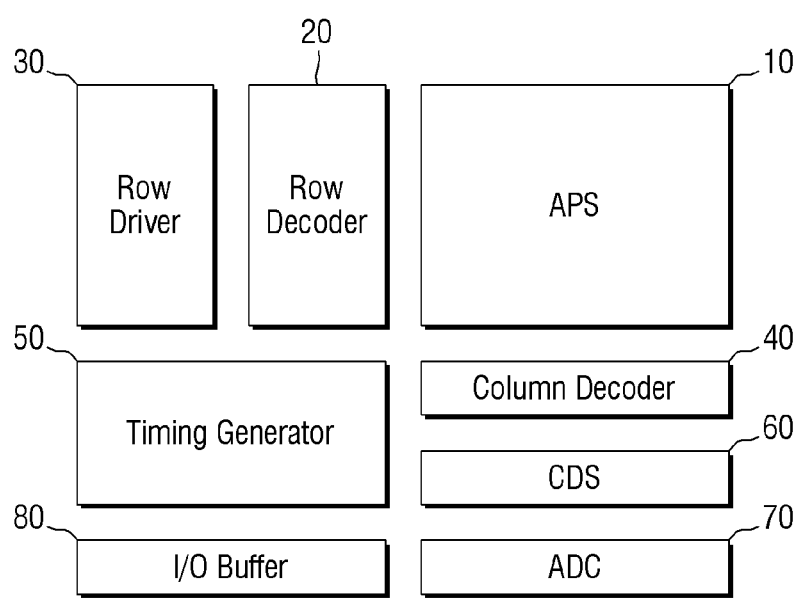
FIG. 1A is a block diagram of an image sensor according to example embodiments.
Figure 1B:
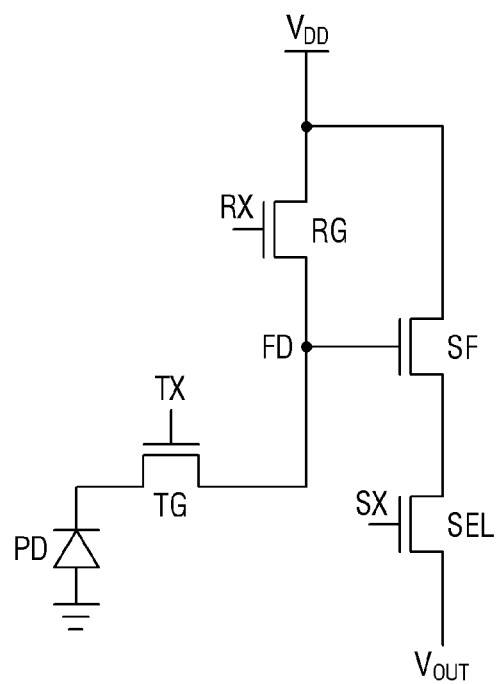
FIG. 1B is a circuit diagram of a unit pixel of the image sensor according to example embodiments.

FIG. 1A is a block diagram of an image sensor according to example embodiments. FIG. 1B is a circuit diagram of a unit pixel of the image sensor according to example embodiments.

Referring to FIG. 1A, the image sensor according to example embodiments includes an active pixel sensor array (APS) 10, a row decoder 20, a row driver 30, a column decoder 40, a timing generator 50, a correlated double sampler (CDS) 60, an analog-to-digital converter (ADS) 70, and an I/O buffer 80.

The active pixel sensor array 10 includes a plurality of unit pixels arranged two-dimensionally, and may convert an optical signal into an electric signal. For example, each of the plurality of unit pixels may generate an electric signal based on light that is incident thereon. The active pixel sensor array 10 may be driven by a plurality of drive signals, such as a pixel selection signal, a reset signal and a charge transfer signal, from the row driver 30. Also, the electrical signal converted by the active pixel sensor array 10 may be provided to the correlated double sampler 60.

The row driver 30 may provide a large number of drive signals for driving a plurality of unit pixels to the active pixel sensor array 10 depending on the results decoded by the row decoder 20. For example, the unit pixels may be provided in the form of a matrix, and the drive signals may be provided for each row.

The timing generator 50 may provide a timing signal and a control signal to both the row decoder 20 and the column decoder 40.

The correlated double sampler (CDS) 60 may receive, hold and sample the electrical signals generated by the active pixel sensor array 10. The correlated double sampler 60 may doubly sample a specific noise level and a signal level due to an electrical signal, and output a difference level corresponding to a difference between the noise level and the signal level.

The analog-to-digital converter (ADC) 70 may convert the analog signal corresponding to the difference level, which is output from the correlated double sampler 60, into a digital signal and output the digital signal.

The I/O buffer 80 latches the digital signal, and the latched signal digital signal may be sequentially output to a video signal processing unit depending on the decoding result from the column decoder 40.

Referring to FIG. 1B, each unit pixel may include a photoelectric conversion layer PD, a transfer transistor TG, a floating diffusion region FD, a reset transistor RG, a source follower transistor SF, and a selection transistor SEL.

The photoelectric conversion element PD may generate electric charges in proportion to an amount of light that is incident from the outside. The photoelectric conversion element PD may be coupled with the transfer transistor TG, which transmits the generated and accumulated electric charges to the floating diffusion region FD. Because the floating diffusion region FD is a region which converts the electric charges into a voltage, and has a parasitic capacitance, the electric charges may be accumulatively stored therein.

One end of the transfer transistor TG may be connected to the photoelectric conversion element PD, and the other end of the transfer transistor TG may be connected to the floating diffusion region FD. The transfer transistor TG may be formed by a transistor that is driven by a predetermined bias (e.g., a transfer signal TX). That is, the transfer transistor TG may transmit the electric charges, which are generated from the photoelectric conversion element PD, to the floating diffusion region FD in accordance with the transfer signal TX.

The source follower transistor SF may amplify a change in electrical potential of the floating diffusion region FD to which the electric charges are sent from the photoelectric conversion element PD and output it to an output line $V_{OUT}$. When the source follower transistor SF is turned on, a predetermined electrical potential provided to a drain of the source follower transistor SF, for example, a power supply voltage VDD, may be sent to a drain region of the selection transistor SEL.

The selection transistor SEL may select a unit pixel to be read on a row basis. The selection transistor SEL may be made up of a transistor that is driven by a selection line that applies a predetermined bias (e.g., a row selection signal SX).

The reset transistor RG may periodically reset the floating diffusion region FD. The reset transistor RG may be made up of a transistor that is driven by a reset line that applies a predetermined bias (e.g., a reset signal RX). When the reset transistor RG is turned on by the reset signal RX, a predetermined electrical potential provided to the drain of the reset transistor RG, for example, a power supply voltage $V_{DD}$, may be sent to the floating diffusion region FD.

Figure 2:
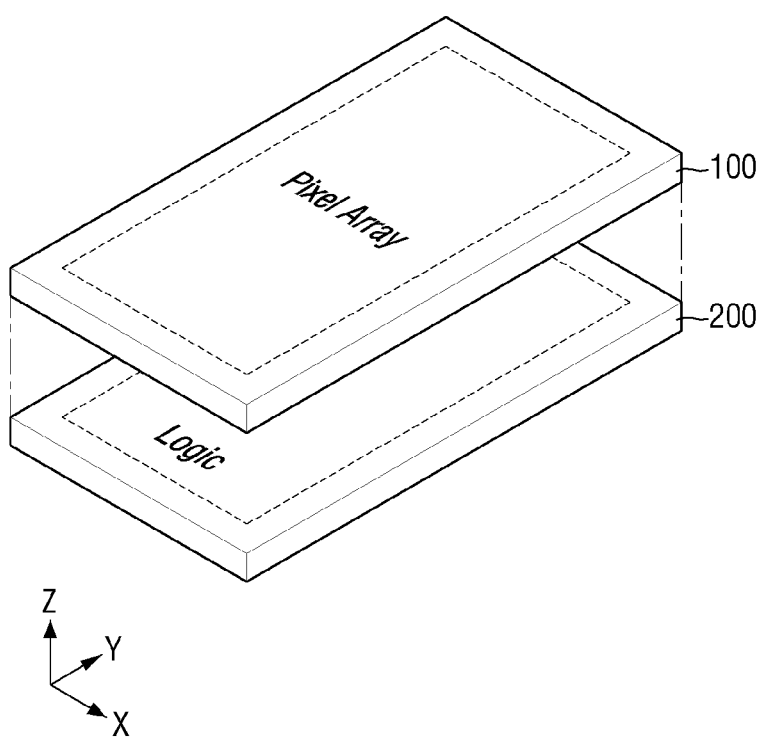
FIG. 2 is a diagram showing a conceptual layout of the image sensor according to example embodiments.

FIG. 2 is a diagram showing a conceptual layout of the image sensor according to example embodiments.

Referring to FIG. 2, the image sensor according to example embodiments may include a first substrate structure 100 and a second substrate structure 200 that are stacked.

A plurality of unit pixels may be arranged in the first substrate structure 100, in a two-dimensional array structure in a plane including a first direction X and a second direction Y. That is, the first substrate structure 100 may include a pixel array. The first direction X and the second direction Y may be perpendicular to each other.

The second substrate structure 200 may include a logic region, or the like. The second substrate structure 200 may be placed below the first substrate structure 100. The first substrate structure 100 and the second substrate structure 200 may be electrically connected to each other. The second substrate structure 200 may allow the pixel signal sent from the first substrate structure 100 to be sent to the logic region of the second substrate structure 200.

Logic elements may be provided in the logic region of the second substrate structure 200. The logic elements may include circuits for processing the pixel signals received from the unit pixels.

The first substrate structure 100 and the second substrate structure 200 may be stacked in a third direction Z. The third direction Z may be a direction that is perpendicular to the first direction X and the second direction Y.

Figure 3:
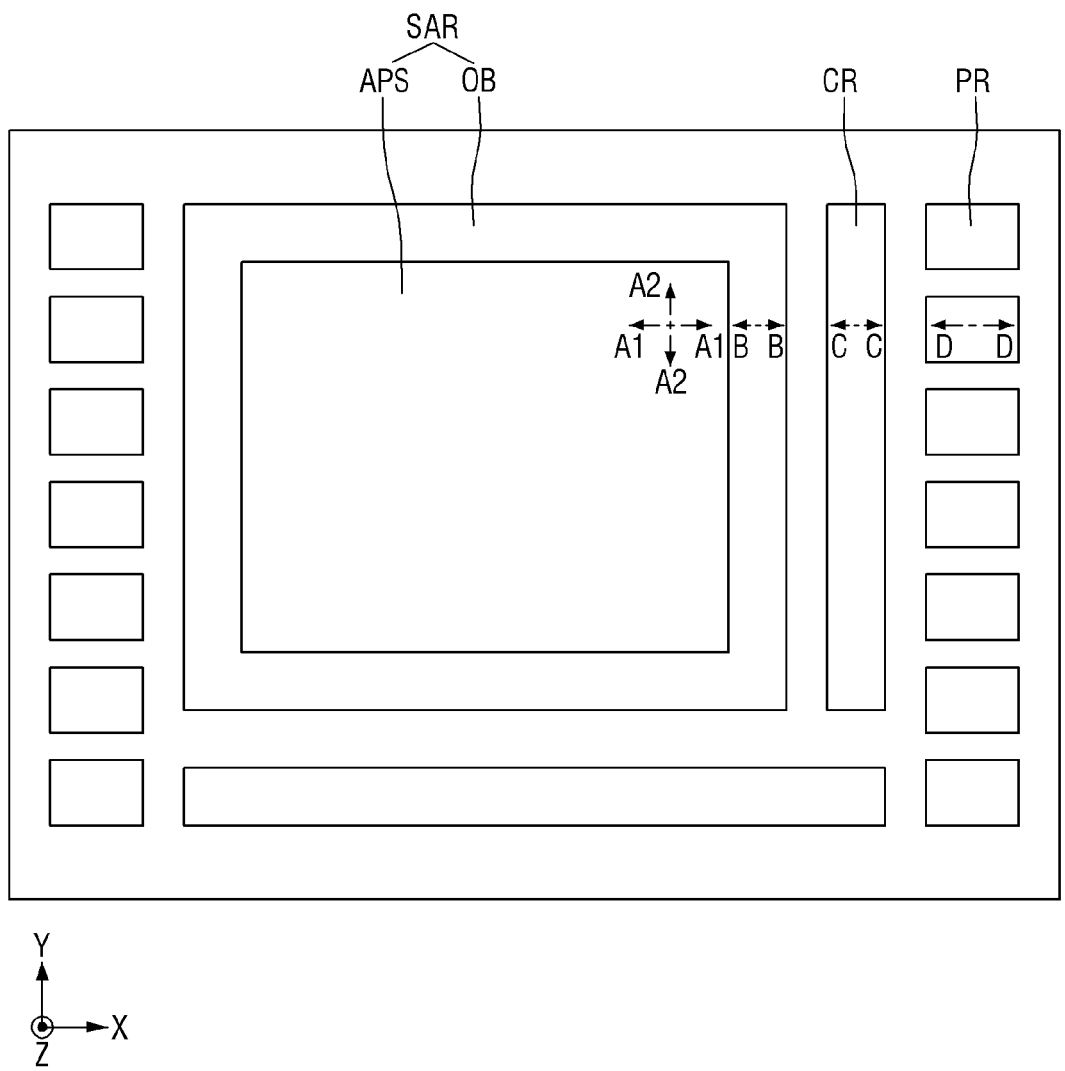
FIG. 3 is a layout diagram of the image sensor according to example embodiments.

FIG. 3 is a layout diagram of the image sensor according to example embodiments.

Referring to FIG. 3, the image sensor according to example embodiments may include a sensor array region SAR, a connecting region CR, and a pad region PR.

The sensor array region SAR may include a region corresponding to the active pixel sensor array 10 of FIG. 1A. For example, a plurality of unit pixels arranged two-dimensionally (e.g., in the form of a matrix) in a plane in which the first direction X and the second direction Y extend may be formed inside the sensor array region SAR.

The sensor array region SAR may include a light-receiving region APS and a light-shielding region OB. Active pixels that receive light and generate an active signal may be arranged inside the light-receiving region APS. Optical black pixels that shield light and generate an optical black signal may be arranged in the light-shielding region OB. Although the light-shielding region OB may be formed, for example, along the periphery of the light-receiving region APS, this is merely an example.

The connecting region CR may be formed around the sensor array region SAR. Although the connecting region CR may be formed on one side of the sensor array region SAR, this is merely an example. Wirings are formed in the connecting region CR, and may be configured to transmit and receive electrical signals of the sensor array region SAR.

The pad region PR may be formed around the sensor array region SAR. Although the pad region PR may be formed to be adjacent to an edge of the image sensor according to example embodiments, this is merely an example. The pad region PR is connected to an external device or the like, and may be configured to transmit and receive electrical signals between the image sensor according to example embodiments, and the external device.

In example embodiments, the light-receiving region APS may be a first region, and the light-shielding region OB, the connecting region CR and the pad region PR may be a second region. That is, the second region may be placed around the first region. However, example embodiments are not limited thereto.

Figure 4:
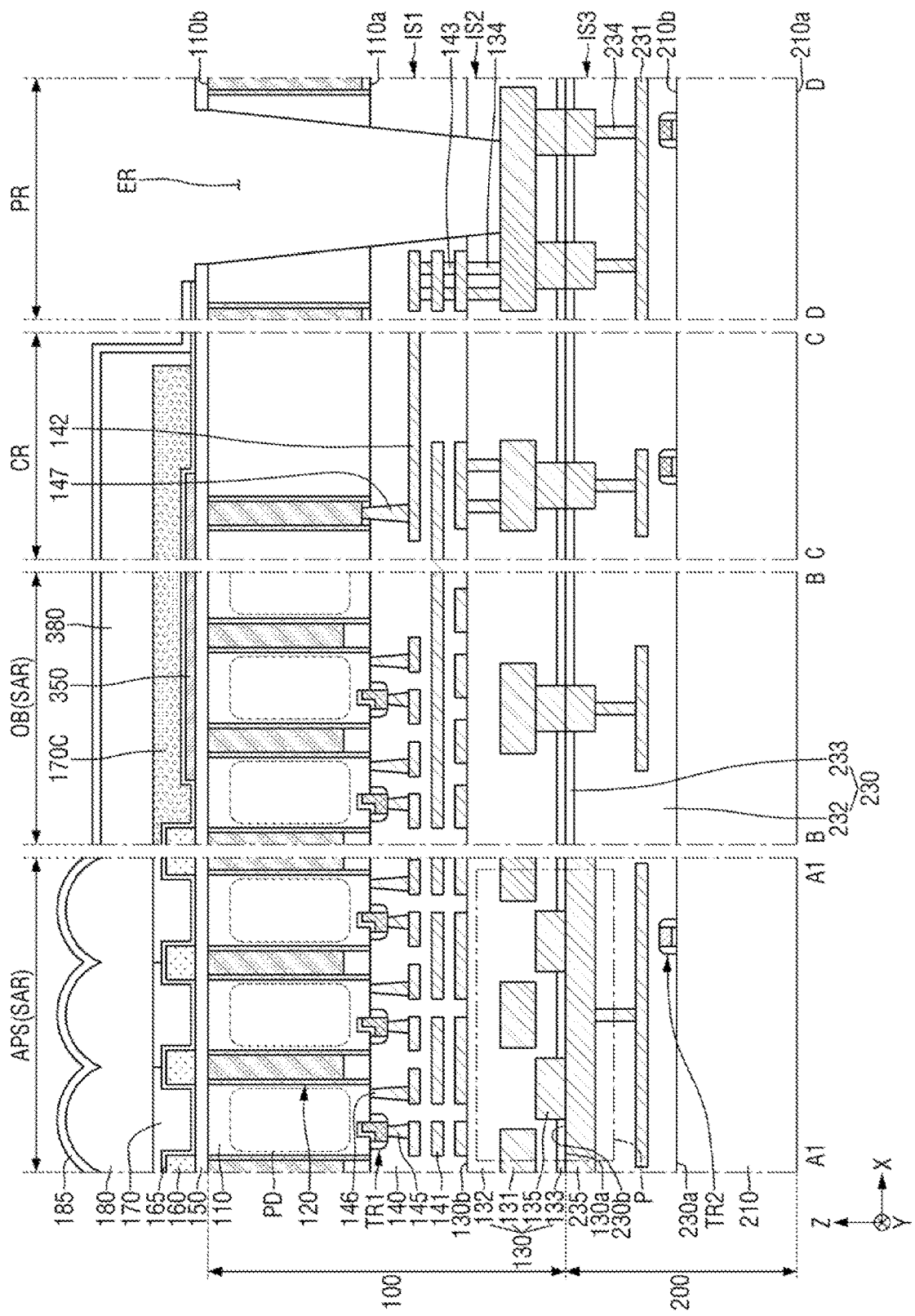
FIG. 4 is a cross-sectional view taken along A1-A1, B-B, C-C and D-D of FIG. 3.
Figure 5:
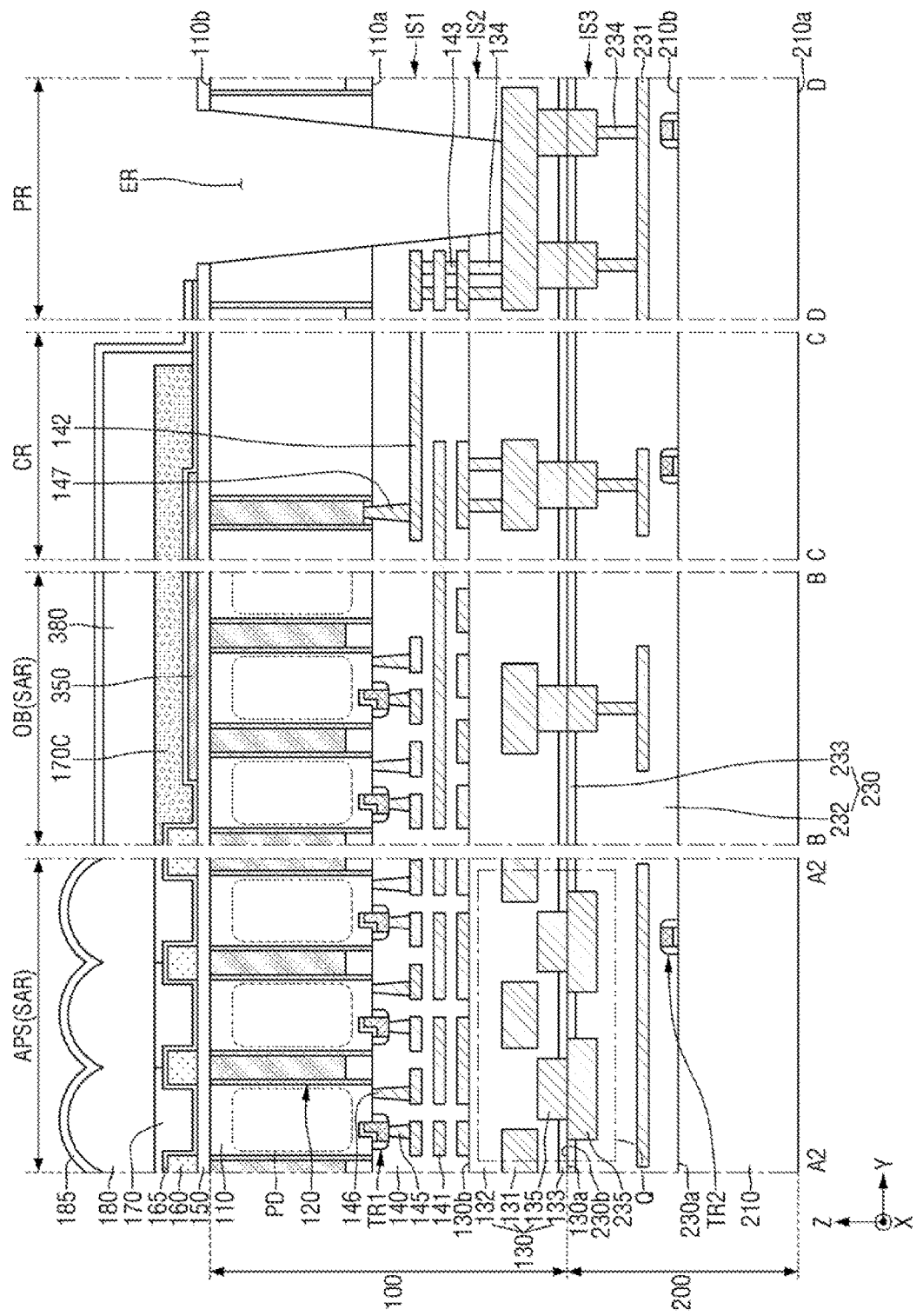
FIG. 5 is a cross-sectional view taken along A2-A2, B-B, C-C and D-D of FIG. 3.

FIG. 4 is a cross-sectional view taken along A1-A1, B-B, C-C and D-D of FIG. 3. FIG. 5 is a cross-sectional view taken along A2-A2, B-B, C-C and D-D of FIG. 3.

Referring to FIGS. 4 and 5, the image sensor according to example embodiments may include a sensor array region SAR, a connecting region CR, and a pad region PR.

The sensor array region SAR may include a region corresponding to the active pixel sensor array 10 of FIG. 1A. For example, a plurality of unit pixels arranged two-dimensionally (e.g., in the form of a matrix) may be formed inside the sensor array region SAR.

The sensor array region SAR may include a light-receiving region APS and a light-shielding region OB. Active pixels that receive light and generate an active signal may be arranged in the light-receiving region APS. Optical black pixels that shield light and generate an optical black signal may be arranged in the light-shielding region OB. Although the light-shielding region OB may be formed, for example, along the periphery of the light-receiving region APS, this is merely an example.

In example embodiments, dummy pixels may be formed in the light-receiving region APS that is adjacent to the light-shielding region OB.

The connecting region CR may be formed around the sensor array region SAR. Although the connecting region CR may be formed on one side of the sensor array region SAR, this is merely an example. Wirings are formed in the connecting region CR, and may be configured to transmit and receive electrical signals of the sensor array region SAR.

The pad region PR may be formed around the sensor array region SAR. Although the pad region PR may be formed to be adjacent to the edge of the image sensor according to example embodiments, this is merely an example. The pad region PR is connected to an external device or the like, and may be configured to transmit and receive electrical signals between the image sensor according to example embodiments, and the external device.

In FIGS. 4 and 5, although the connecting region CR is shown as being interposed between the sensor array region SAR and the pad region PR, this is merely an example. The placement of the sensor array region SAR, the connecting region CR and the pad region PR may vary.

The image sensor according to example embodiments may include a first substrate 110, a pixel separation pattern 120, a first wiring structure IS1, a second wiring structure IS2, a second substrate 210, a third wiring structure IS3, a surface insulating film 150, a first color filter 170, a grid pattern 160, a microlens 180, a pad pattern 131, a first connection pattern 135, and a second connection pattern 235.

The first substrate 110 may be a semiconductor substrate. For example, the first substrate 110 may be bulk silicon or SOI (silicon-on-insulator). The first substrate 110 may be a silicon substrate or may include other substances, for example, silicon germanium, indium antimonide, lead tellurium compounds, indium arsenic, indium phosphide, gallium arsenide or gallium antimonide. Alternatively, the first substrate 110 may have an epitaxial layer formed on a base substrate.

The first substrate 110 may include a first surface 110a and a second surface 110b that are opposite to each other. In example embodiments described below, the first surface 110a may be referred to as a front side of the first substrate 110, and the second surface 110b may be referred to as a back side of the first substrate 110. In example embodiments, the second surface 110b of the first substrate 110 may be a light-receiving surface on which light is incident. That is, the image sensor according to example embodiments may be a backside illumination (BSI) image sensor.

A plurality of unit pixels may be formed on the first substrate 110 of the sensor array region SAR. A plurality of pixels arranged two-dimensionally (e.g., in the form of a matrix) in a plane including the first direction X and the second direction Y may be formed inside the light-receiving region APS.

Each unit pixel may include a photoelectric conversion layer PD. The photoelectric conversion layer PD may be formed inside the first substrate 110 of the light-receiving region APS and the light-shielding region OB. The photoelectric conversion layer PD may generate electric charges in proportion to an amount of light that is incident from the outside. In example embodiments, a dummy photoelectric conversion layer may be formed inside a part of the light-shielding region OB. That is, the photoelectric conversion layer PD formed in the light-shielding region OB may be an active photoelectric conversion layer, and may be a dummy photoelectric conversion layer. However, example embodiments are not limited thereto.

The photoelectric conversion layer PD may include, but is not limited thereto, for example, at least one of a photo diode, a photo transistor, a photo gate, a pinned photo diode, an organic photo diode, a quantum dot, and a combination thereof Each unit pixel may include a first electronic element TR1. In example embodiments, the first electronic element TR1 may be formed on the first surface 110a of the first substrate 110. The first electronic element TR1 may be connected to the photoelectric conversion layer PD to form various transistors for processing electric signals. For example, the first electronic element TR1 may constitute transistors such as the transfer transistor TG, the reset transistor RG, the source follower transistor SF or the selection transistor SEL described above with respect to FIG. 1B.

In example embodiments, the first electronic element TR1 may include a vertical transfer transistor. For example, the first electronic element TR1 constituting the transfer transistor TG described above may partially extend into the first substrate 110. Such a transfer transistor TG may reduce an area of the unit pixel to enable a high integration of the image sensor.

The pixel separation pattern 120 may be formed inside the first substrate 110 of the sensor array region SAR. The pixel separation pattern 120 may be formed, for example, by burying an insulating material inside a deep trench formed by patterning the first substrate 110. The pixel separation pattern 120 may penetrate the first substrate 110. For example, the pixel separation pattern 120 may extend from the first surface 110a to the second surface 110b.

The pixel separation pattern 120 may define a plurality of unit pixels. The pixel separation pattern 120 is formed in a grid pattern from a planar viewpoint, and may separate a plurality of pixels from each other.

The pixel separation pattern 120 may include an insulating spacer film and a filling conductive film. The insulating spacer film may be placed along the side walls of pixel separation pattern 120. The filling conductive film may be placed between the insulating spacer films.

The insulating spacer film may include an oxide film having a lower refractive index than the first substrate 110. For example, the insulating spacer film may include, but is not limited to, at least one of silicon oxide, aluminum oxide, tantalum oxide, and combinations thereof The insulating spacer film, which has a lower refractive index than the first substrate 110, may refract or reflect light which is obliquely incident on the photoelectric conversion layer PD. Also, the insulating spacer film may prevent the photoelectric charges generated in a specific unit pixel due to the incident light from moving to the adjacent unit pixel by a random drift. That is, the insulating spacer film may improve the light-receiving rate of the photoelectric conversion layer PD to improve the quality of the image sensor according to example embodiments.

In example embodiments, the filling conductive film may include a conductive substance. For example, the filling conductive film may include, but is not limited to, polysilicon (poly Si). In example embodiments, a ground voltage or a negative voltage may be applied to the filling conductive film including the conductive substance. Therefore, it is possible to effectively prevent an electrostatic discharge (ESD) bruise defect of the image sensor according to example embodiments. Here, the ESD bruise defect means a phenomenon in which the electric charges generated by ESD or the like are accumulated on the surface of the substrate (for example, the second surface 110b) and cause a bruise-like defect to be generated on the image.

The first wiring structure IS1 may be formed on the first substrate 110. For example, the first wiring structure IS1 may cover the first surface 110a of the first substrate 110. The second wiring structure IS2 may be formed on the first wiring structure IS1. The first wiring structure IS1 may be placed between the first substrate 110 and the second wiring structure IS2. That is, a lower surface of the first wiring structure IS1 may be in contact with the first surface 110a of the first substrate 110. An upper surface of the first wiring structure IS1 may be in contact with the lower surface of the second wiring structure IS2. The first substrate 110, the first wiring structure IS1, and the second wiring structure IS2 may form the first substrate structure 100.

The first wiring structure IS1 may be made up of one or multiple wirings. For example, the first wiring structure IS1 may include a first inter-wiring insulating film 140, and a plurality of wirings 132 and 134 and a plurality of contacts 143, 145, 146 and 147 inside the first inter-wiring insulating film 140. In FIGS. 4 and 5, the number of layers of the wiring patterns forming the first wiring structure IS1 and the arrangement thereof are examples. The first inter-wiring insulating film 140 may include, for example, but is not limited to, at least one of silicon oxide, silicon nitride, silicon oxynitride, and a low dielectric constant (low-k) substance having a lower dielectric constant than silicon oxide.

In example embodiments, the first wiring structure IS1 may include a first wiring pattern 141 in the sensor array region SAR, and a second wiring pattern 142 in the connecting region CR. The first wiring pattern 141 may be electrically connected to a unit pixel of the sensor array region SAR. For example, the first wiring pattern 141 may be connected to the first electronic element TR1. The second wiring pattern 142 may extend from the sensor array region SAR. For example, the second wiring pattern 142 may be electrically connected to at least a part of the first wiring pattern 141. Therefore, the second wiring pattern 142 may be electrically connected to the unit pixel of the sensor array region SAR.

In example embodiments, the first wiring structure IS1 may include a first contact 145 and a second contact 146 in the sensor array region SAR, a third contact 147 in the connecting region CR, and a fourth contact 143 in the pad region PR. The first contact 145 may be connected to the first electronic element TR1. The second contact 146 may be connected to the first substrate 110. The second contact 146 may be connected to a source/drain region. The third contact 147 may be connected to the second wiring pattern 142 and the pixel separation pattern 120. The fourth contact 143 may be connected to the pad pattern 131.

In example embodiments, a ground voltage or a negative voltage may be applied to the pixel separation pattern 120, using the third contact 147. Accordingly, an ESD bruise defect of the image sensor according to example embodiments may be prevented.

The first wiring pattern 141 and the second wiring pattern 142 may include, for example, but are not limited to, at least one of tungsten (W), copper (Cu), aluminum (Al), gold (Au), silver (Ag), and alloys thereof The first contact 145, the second contact 146, the third contact 147 and the fourth contact 143 may include, but are not limited to, at least one of tungsten (W), copper (Cu), aluminum (Al), gold (Au), silver (Ag), and alloys thereof.

The second wiring structure IS2 may be made up of a second inter-wiring insulating film 130, a pad pattern 131, a first connection pattern 135, and a plurality of contacts 133. In FIGS. 4 and 5, the number of layers of the wiring patterns constituting the second wiring structure IS2 and the arrangements thereof are examples, and example embodiments are not limited thereto.

The second inter-wiring insulating film 130 may include an upper surface 130a and a lower surface 130b that are opposite to each other. The lower surface 130b of the second inter-wiring insulating film 130 may face the first surface 110a of the first substrate 110. The upper surface 130a of the second inter-wiring insulating film 130 may face the lower surface 230b of a third inter-wiring insulating film 230.

The second inter-wiring insulating film 130 may include a first interlayer insulating film 132 and a first bonding insulating film 133. The first bonding insulating film 133 may be placed on the first interlayer insulating film 132. The lower surface of the first interlayer insulating film 132 may be the lower surface 130b of the second inter-wiring insulating film 130. The upper surface of the first bonding insulating film 133 may be the upper surface 130a of the second inter-wiring insulating film 130. That is, the first bonding insulating film 133 may define the upper surface 130a of the second inter-wiring insulating film 130.

The first interlayer insulating film 132 may include, for example, but is not limited to, at least one of silicon oxide, silicon nitride, silicon oxynitride, and a low dielectric constant (low-k) substance having a lower dielectric constant than silicon oxide.

The first bonding insulating film 133 may include, for example, but is not limited to, silicon carbonitride (SiCN).

The pad pattern 131 may be buried inside the second inter-wiring insulating film 130. The pad pattern 131 may be buried inside the first interlayer insulating film 132. In the light-receiving region APS, the pad pattern 131 may serve to shield electrical signals generated inside the image sensor according to example embodiments from the outside of the image sensor. Further, the pad pattern 131 may serve to shield the first electronic element TR1 inside the image sensor from an electric signal generated outside the image sensor.

In example embodiments, the surface of the pad pattern 131 may be exposed. For example, the surface of the pad pattern 131 may be exposed in the pad region PR. The pad pattern 131 may be exposed by an opening which penetrates through the surface insulating film 150, the first substrate 110, the first inter-wiring insulating film 140, and the second inter-wiring insulating film 130. For example, an exposure opening ER which exposes the pad pattern 131 may be formed inside the second inter-wiring insulating film 130. Accordingly, the pad pattern 131 may be connected to an external device or the like and configured to transmit and receive electrical signals between the image sensor according to example embodiments and the external device.

The pad pattern 131 may include, for example, but is not limited to, at least one of tungsten (W), copper (Cu), aluminum (Al), gold (Au), silver (Ag), titanium nitride (TiN), and alloys thereof.

A fifth contact 134 may connect the pad pattern 131 to a plurality of wiring patterns of the first wiring structure IS1. That is, the pad pattern 131, the fifth contact 134, the second wiring pattern 142, and the third contact 147 may be electrically connected. The fifth contact 134 may include, for example, but is not limited to, at least one of tungsten (W), copper (Cu), aluminum (Al), gold (Au), silver (Ag), and alloys thereof.

The first connection pattern 135 may be provided inside the second inter-wiring insulating film 130. The first connection pattern 135 may penetrate the first bonding insulating film 133. The upper surface of the first connection pattern 135 may be placed on the same plane as the upper surface 130a of the second inter-wiring insulating film 130. The upper surface of the first connection pattern 135 may be placed on the same plane as the upper surface of the first bonding insulating film 133.

The first connection pattern 135 may be exposed from the upper surface 130a of the second inter-wiring insulating film 130. The first connection pattern 135 may be exposed from the lower surface 230b of the third inter-wiring insulating film 230. The first connection pattern 135 may have various columnar shapes such as a cylindrical shape, a conical shape, a polygonal column shape, and a polygonal pyramid shape.

In the light-receiving region APS, the first connection pattern 135 may serve to shield electrical signals generated inside the image sensor according to example embodiments from the outside of the image sensor. Further, the first connection pattern 135 may serve to shield the first electronic element TR1 inside the image sensor from electric signals generated outside the image sensor.

In the light-receiving region APS, the first connection pattern 135 may not be in contact with the pad pattern 131. The second connection pattern 235 may be in contact with the first connection pattern 135. The first connection pattern 135 may be in contact with the pad pattern 131 in the light-shielding region OB, the connecting region CR and the pad region PR. However, example embodiments are not limited thereto, and unlike the shown example, the first connection pattern 135 may be in contact with the pad pattern 131 in the light-receiving region APS. Also, the first connection pattern 135 may not be in contact with the pad pattern 131 in the light-shielding region OB, the connecting region CR and the pad region PR.

The first connection pattern 135 may include a conductive substance. The first connection pattern 135 may include, for example, but is not limited to, copper (Cu).

The second substrate 210 may be bulk silicon or SOI (silicon-on-insulator). The second substrate 210 may be a silicon substrate or may include other substances, for example, silicon germanium, indium antimonide, lead tellurium compounds, indium arsenic, indium phosphide, gallium arsenide or gallium antimonide. Alternatively, the second substrate 210 may have an epitaxial layer formed on a base substrate.

The second substrate 210 may include a third surface 210a and a fourth surface 210b that are opposite to each other. In example embodiments, the fourth surface 210b of the second substrate 210 may be a surface that faces the second surface 110b of the first substrate 110.

A plurality of electronic elements may be formed on the second substrate 210. For example, a second electronic element TR2 may be formed on the fourth surface 210b of the second substrate 210. The second electronic element TR2 may be electrically connected to the sensor array region SAR to transmit and receive electrical signals to and from each unit pixel of the sensor array region SAR. For example, the second electronic element TR2 may include electronic elements that constitute the row decoder 20, the row driver 30, the column decoder 40, the timing generator 50, the correlated double sampler 60, the analog-to-digital converter 70 or the I/O buffer 80 of FIG. 1A.

The third wiring structure IS3 may be formed on the second substrate 210. For example, the third wiring structure IS3 may cover the fourth surface 210b of the second substrate 210. The second substrate 210 and the third wiring structure IS3 may form the second substrate structure 200.

The third wiring structure IS3 may be attached to the second wiring structure IS2. For example, the upper surface of the third wiring structure IS3 may be attached to the upper surface of the second wiring structure IS2. Specifically, the upper surface 130a of the second inter-wiring insulating film 130 and the lower surface 230b of the third inter-wiring insulating film 230 may be bonded to each other.

The third wiring structure IS3 may be made up of one or multiple wirings, a plurality of contacts, and the second connection pattern 235. The third wiring structure IS3 may include the third inter-wiring insulating film 230, a third wiring pattern 231, a sixth contact 233, and the second connection pattern 235. In FIGS. 4 and 5, the number of layers of the wirings constituting the third wiring structure IS3 and the arrangement thereof are examples, and example embodiments are not limited thereto.

The third inter-wiring insulating film 230 may include a lower surface 230b and an upper surface 230a that are opposite to each other. The lower surface 230b of the third inter-wiring insulating film 230 may face the upper surface 130a of the second inter-wiring insulating film 130. The upper surface 230a of the third inter-wiring insulating film 230 may face the fourth surface 210b of the second substrate 210.

The third inter-wiring insulating film 230 may include a second interlayer insulating film 232 and a second bonding insulating film 233. An upper surface of the second interlayer insulating film 232 may be the upper surface 230a of the third inter-wiring insulating film 230. A lower surface of the second bonding insulating film 233 may be the lower surface 230b of the third inter-wiring insulating film 230. That is, the second bonding insulating film 233 may define the lower surface 230b of the third inter-wiring insulating film 230.

The second interlayer insulating film 232 may include, for example, but is not limited to, at least one of silicon oxide, silicon nitride, silicon oxynitride, and a low dielectric constant (low-k) substance having a lower dielectric constant than silicon oxide. The second bonding insulating film 233 may include, for example, but is not limited to, silicon carbonitride (SiCN) in example embodiments. The third wiring structure IS3 may include the same material as the first wiring structure IS1 and the second wiring structure IS2.

The second connection pattern 235 may be provided inside the third inter-wiring insulating film 230. The second connection pattern 235 may penetrate the second bonding insulating film 233. The lower surface of the second connection pattern 235 may be placed on the same plane as the lower surface 230b of the third inter-wiring insulating film 230. The lower surface of the second connection pattern 235 may be placed on the same plane as the lower surface of the second bonding insulating film 233.

The second connection pattern 235 may be exposed from the upper surface 130a of the second inter-wiring insulating film 130. The second connection pattern 235 may be exposed from the lower surface 230b of the third inter-wiring insulating film 230. The second connection pattern 235 may have, for example, various columnar shapes such as a cylindrical shape, a conical shape, a polygonal column shape, and a polygonal pyramid shape.

In the light-receiving region APS, the second connection pattern 235 may serve to shield the electrical signals generated inside the image sensor according to example embodiments from the outside of the image sensor. Further, the second connection pattern 235 may serve to shield the first electronic element TR1 inside the image sensor from electric signals generated outside.

The image sensor according to example embodiments may shield the electrical signals generated outside and inside the image sensor, using the pad pattern 131, the first connection pattern 135, and the second connection pattern 235. In the light-receiving region APS, the pad pattern 131, the first connection pattern 135 and the second connection pattern 235 may completely shield the inside of the image sensor from the electric signals generated outside the image sensor. Further, in the light-receiving region APS, the pad pattern 131, the first connection pattern 135, and the second connection pattern 235 may shield the electric signals generated inside the image sensor from the outside of the image sensor. However, example embodiments are not limited thereto.

In example embodiments, the pad pattern 131, the first connection pattern 135, and the second connection pattern 235 may be electrically connected. A contact for connecting the pad pattern 131 and the second connection pattern 235 may be formed, when the pad pattern 131 and the first connection pattern 135 are not connected to each other. The pad pattern 131 may be connected to the second connection pattern 235. The second connection pattern 235 may be connected to the first connection pattern 135. That is, the pad pattern 131, the first connection pattern 135, and the second connection pattern 235 may be electrically connected to each other. However, example embodiments are not limited thereto.

In FIG. 4, the second connection pattern 235 may extend in the first direction X. Specifically, in the light-receiving region APS, the second connection pattern 235 may extend in the first direction X. In FIG. 5, the second connection patterns 235 may be spaced apart from each other. Specifically, in the light-receiving region APS, the second connection patterns 235 may be spaced apart from each other in the second direction Y. That is, the second connection patterns 235 may extend in the first direction X and spaced apart from each other in the second direction Y from a planar viewpoint.

The second connection pattern 235 may include a conductive substance. The second connection pattern 235 may include, for example, but is not limited to, copper (Cu).

The second inter-wiring insulating film 130 and the third inter-wiring insulating film 230 may be bonded to each other. For example, the upper surface 130a of the second inter-wiring insulating film 130 and the lower surface 230b of the third inter-wiring insulating film 230 may be in contact with each other. Specifically, the first connection pattern 135 and the second connection pattern 235 may be bonded to each other. The first bonding insulating film 133 and the second bonding insulating film 233 may be bonded to each other. The first bonding insulating film 133 and the second connection pattern 235 may be bonded to each other. The first connection pattern 135 and the second bonding insulating film 233 may be bonded to each other. However, example embodiments are not limited thereto.

A third wiring pattern 231 may be connected to the second connection pattern 235 through the sixth contact 234. The third wiring pattern 231 may be connected to the pad pattern 131, using the second connection pattern 235 and the sixth contact 234.

The third wiring pattern 231 may include, for example, but is not limited to, at least one of tungsten (W), copper (Cu), aluminum (Al), gold (Au), silver (Ag), and alloys thereof The sixth contact 234 may include, for example, but is not limited to, at least one of tungsten (W), copper (Cu), aluminum (Al), gold (Au), silver (Ag), and alloys thereof The surface insulating film 150 may be formed on the second surface 110b of the first substrate 110. The surface insulating film 150 may extend along the second surface 110b of the first substrate 110. In example embodiments, at least a part of the surface insulating film 150 may be in contact with the pixel separation pattern 120.

The surface insulating film 150 may include an insulating material. For example, the surface insulating film 150 may include, but is not limited to, at least one of silicon oxide, silicon nitride, silicon oxynitride, aluminum oxide, hafnium oxide, and a combination thereof The surface insulating film 150 may function as an antireflection film to prevent reflection of light that is incident on the first substrate 110, thereby improving the light-receiving rate of the photoelectric conversion layer PD. Further, the surface insulating film 150 may function as a flattening film to form a first color filter 170 and a microlens 180, which will be described later, at a uniform height.

The first color filter 170 may be formed on the surface insulating film 150 of the light-receiving region APS. In example embodiments, the first color filters 170 may be arranged to correspond to each unit pixel. For example, a plurality of first color filters 170 may be arranged two-dimensionally (for example, in the form of a matrix) in the plane including the first direction X and the second direction Y.

The first color filter 170 may have various color filters depending on the unit pixel. For example, the first color filter 170 may be arranged in a Bayer pattern that includes a red color filter, a green color filter, and a blue color filter. However, this is only an example, and the first color filter 170 may include other color filters, such as a yellow filter, a magenta filter, a cyan filter, and a white filter.

A grid pattern 160 may be formed on the surface insulating film 150. The grid pattern 160 may be formed in a grid shape from a planar viewpoint, and may be interposed between the plurality of first color filters 170.

The grid pattern 160 may include a low refractive index substance having a lower refractive index than silicon (Si). For example, the grid pattern 160 may include, but is not limited to, at least one of silicon oxide, aluminum oxide, tantalum oxide, and a combination thereof The grid pattern 160 including the low refractive index substance may improve the quality of the image sensor, by refracting or reflecting the light which is obliquely incident on the image sensor.

In example embodiments, a first protective film 165 may be formed on the surface insulating film 150 and the grid pattern 160. The first protective film 165 may be interposed between the surface insulating film 150 and the first color filter 170, and between the grid pattern 160 and the first color filter 170. For example, the first protective film 165 may extend along the profiles of the upper surface of the surface insulating film 150, and the side surfaces and upper surface of the grid pattern 160.

The first protective film 165 may include, for example, but is not limited to, aluminum oxide. The first protective film 165 may prevent damage to the surface insulating film 150 and the grid pattern 160.

The microlens 180 may be formed on the first color filter 170. The microlens 180 may be arranged to correspond to each unit pixel. For example, the microlens 180 may be arranged two-dimensionally (for example, in the form of a matrix) in the plane including the first direction X and the second direction Y.

The microlens 180 has a convex shape which protrudes away from the first color filter 170, and may have a predetermined radius of curvature. Accordingly, the microlens 180 may concentrate the light which is incident on the photoelectric conversion layer PD. The microlens 180 may include, for example, but is not limited to, a light-transmitting resin.

In example embodiments, a second protective film 185 may be formed on the microlens 180. The second protective film 185 may extend along the surface of the microlens 180. The second protective film 185 may include, for example, an inorganic oxide film. For example, the second protective film 185 may include, but is not limited to, at least one of silicon oxide, titanium oxide, zirconium oxide, hafnium oxide, and a combination thereof In example embodiments, the second protective film 185 may include a low temperature oxide (LTO).

The second protective film 185 may protect the microlens 180 from the outside. For example, the microlens 180 may include an organic substance, and the second protective film 185, which includes an inorganic oxide film, may protect the organic substance of the microlens 180. Also, the second protective film 185 may improve the light concentration capability of the microlens 180. For example, the second protective film 185 may reduce reflection, refraction, scattering, or the like of incident light that reaches the space between the microlenses 180, by filling the space between the microlenses 180.

The image sensor according to example embodiments may further include a connecting structure 350.

The connecting structure 350 may be formed inside the light-shielding region OB. The connecting structure 350 may be formed inside the connecting region CR. The connecting structure 350 may overlap the pixel separation pattern 120 inside the light-shielding region OB in the third direction Z. The connecting structure 350 may be placed to overlap the dummy pixel separation pattern 320 inside the connecting region CR in the third direction Z. The connecting structure 350 may serve to shield light that is incident on the light-shielding region OB or the connecting region CR.

The connecting structure 350 may be placed on the surface insulating film 150. The connecting structure 350 may not be in contact with the pixel separation pattern 120. That is, the surface insulating film 150 may be interposed between the connecting structure 350 and the pixel separation pattern 120.

The connecting structure 350 may include, for example, but is not limited to, at least one of a titanium (Ti) film, a titanium nitride (TiN) film, a tungsten (W) film, and a combination film thereof In example embodiments, a second color filter 170C may be placed on the second surface 110b of the first substrate 110 of the light-shielding region OB and the connecting region CR. The second color filter 170C may be cover a part of the first protective film 165 inside the light-shielding region OB and the connecting region CR. The second color filter 170C may cover the connecting structure 350 inside the light-shielding region OB and the connecting region CR. The second color filter 170C may include, for example, but is not limited to, a blue color filter.

In example embodiments, a third protective film 380 may be formed on the second color filter 170C. For example, the third protective film 380 may cover a part of the first protective film 165 inside the light-shielding region OB and the connecting region CR. In example embodiments, the second protective film 185 may extend along the surface of the third protective film 380. The third protective film 380 may include, for example, but is not limited to, a light-transmitting resin. In example embodiments, the third protective film 380 may include the same substance as the microlens 180.

Figure 6:
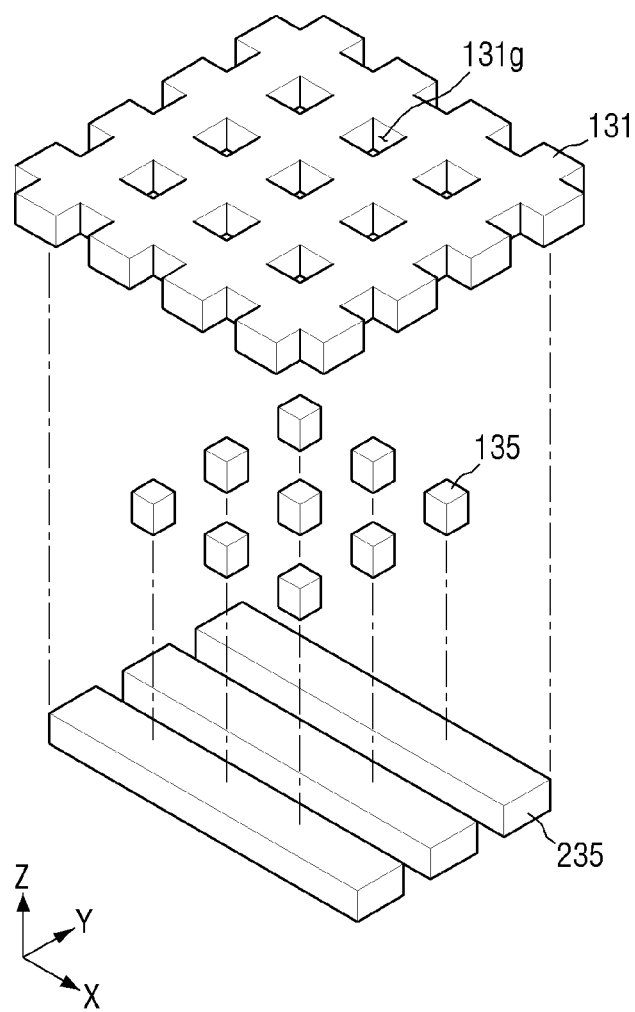
FIG. 6 is a combined perspective view of a pad pattern, first connection pattern and second connection pattern according to example embodiments.
Figure 7:
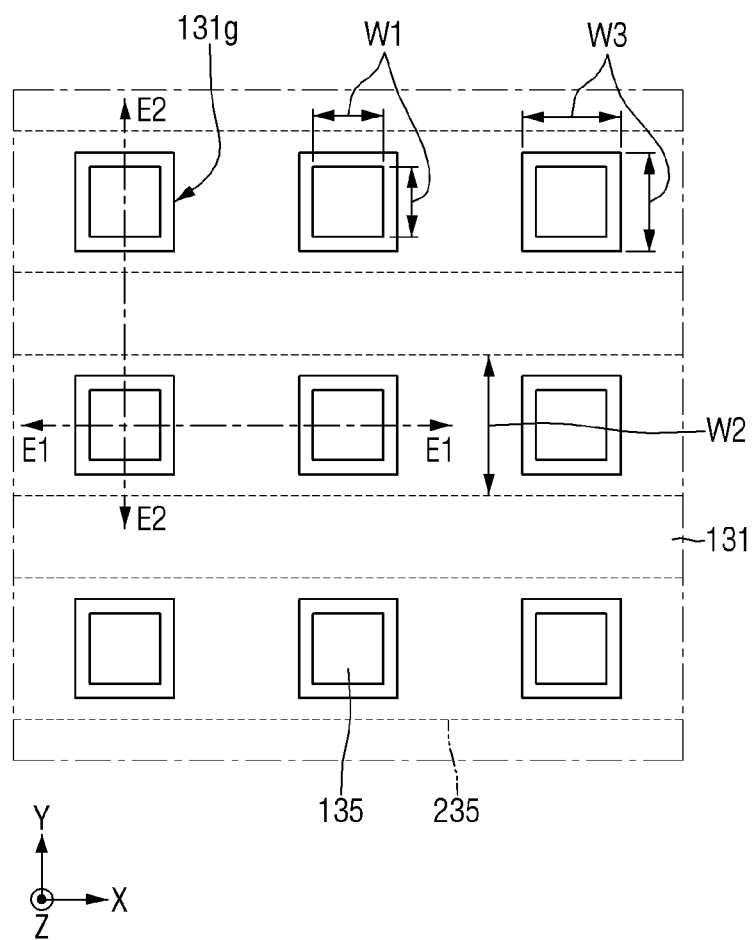
FIG. 7 is a plan view of a region P of FIG. 4 and a region Q of FIG. 5.
Figure 8:
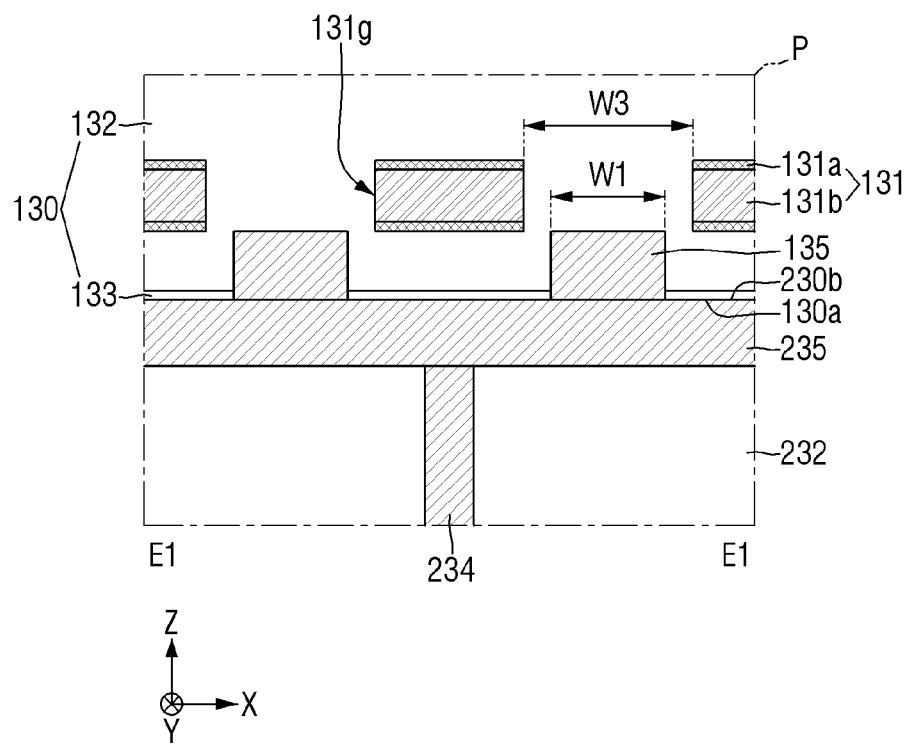
FIG. 8 is a cross-sectional view taken along E1-E1 of FIG. 7.
Figure 9:
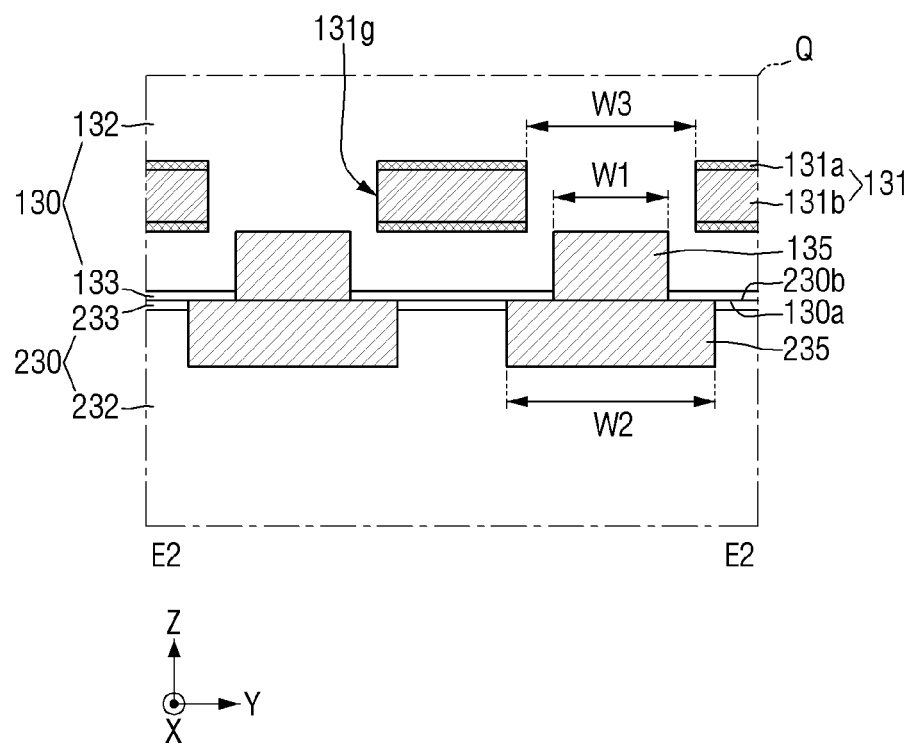
FIG. 9 is a cross-sectional view taken along E2-E2 of FIG. 7.

FIG. 6 is a combined perspective view of a pad pattern, first connection pattern and second connection pattern according to example embodiments. FIG. 7 is a plan view of a region P of FIG. 4 and a region Q of FIG. 5. FIG. 8 is a cross-sectional view taken along E1-E1 of FIG. 7. FIG. 9 is a cross-sectional view taken along E2-E2 of FIG. 7. For reference, FIG. 7 may be a plan view of FIG. 6. FIG. 8 may be an enlarged view of a region P of FIG. 4. FIG. 9 may be an enlarged view of a region Q of FIG. 5. The pad pattern 131, the first connection pattern 135, and the second connection pattern 235 according to example embodiments will be described in more detail referring to FIGS. 6 to 9.

Referring to FIGS. 6 to 9, the pad pattern 131 may have a grid shape from a planar viewpoint.

The grid shape of the pad pattern 131 may define one or more a grid holes. A grid hole 131g may be, for example, a region corresponding to a grid point in the grid shape. The grid hole 131g may be filled with the first interlayer insulating film 132. The pad pattern 131 may be provided in a grid shape and buried inside the second inter-wiring insulating film 130. The pad pattern 131 may be provided in a grid shape and buried inside the first interlayer insulating film 132.

The grid hole 131g may have, but is not limited to, a square shape from a planar viewpoint. According to example embodiments, the grid hole 131g may have various shapes such as a rectangle, a circle, and an ellipse. Hereinafter, the grid hole 131g will be described as having a square shape from the planar viewpoint. For example, a width of the grid hole 131g in the first direction X may be a third width W3, and a width of the grid hole 131g in the second direction Y may be the third width W3.

The first connection pattern 135 may be provided in an island shape from the planar viewpoint. The first connection pattern 135 may be provided in a region in which it overlaps the grid hole 131g in the third direction Z. The first connection pattern 135 may have, but is not limited to, a square shape from the planar viewpoint. The first connection pattern 135 may have various shapes such as a rectangle, a circle, an ellipse, a triangle, and a rhombus from the planar viewpoint. Hereinafter, the first connection pattern 135 will be described as having a square shape from the planar viewpoint. The width of the first connection pattern 135 in the first direction X and the width in the second direction Y may be the first width W1.

The second connection pattern 235 may extend in the first direction X. The second connection patterns 235 may be spaced apart from each other in the second direction Y. The second connection pattern 235 may be in contact with the first connection pattern 135. The width of the second connection pattern 235 in the second direction Y may be constant. For example, the width of the second connection pattern 235 in the second direction Y may be the second width W2.

In example embodiments, the pad pattern 131 may include a pad pattern liner film 131a and a pad pattern filling film 131b. The pad pattern liner film 131a may be placed, for example, along the upper surface and the bottom surface of the pad pattern 131. The pad pattern filling film 13 1b may be placed between the pad pattern liner films 131a. The pad pattern liner film 131a may include, for example, titanium nitride (TiN). The pad pattern filling film 131b may include, for example, aluminum (Al). However, example embodiments are not limited thereto.

In FIG. 8, the third width W3 of the grid hole 131g in the first direction X is greater than the first width W1 of the first connection pattern 135 in the first direction X. The first connection pattern 135 does not overlap the pad pattern 131 in the third direction Z. The first connection pattern 135 overlaps at least a part of the grid hole 131g in the third direction Z. The upper surface of the pad pattern 131 may be placed on the same plane as the lower surface of the first connection pattern 135. The upper surface of the pad pattern 131 may be a surface that faces the lower surface 230b of the third inter-wiring insulating film 230. The lower surface of the first connection pattern 135 may be a surface that is opposite to the upper surface 130a of the second inter-wiring insulating film 130.

The pad pattern 131 and the first connection pattern 135 may not overlap in the first direction X or the second direction Y. That is, the pad pattern 131 and the first connection pattern 135 may not be in contact with each other. However, example embodiments are not limited thereto.

In FIG. 9, the third width W3 of the grid hole 131g in the second direction Y is greater than the first width W1 of the first connection pattern 135 in the second direction Y. The third width W3 of the grid hole 131g in the second direction Y is smaller than the second width W2 of the second connection pattern 235 in the second direction Y. That is, the grid hole 131g completely overlaps the second connection pattern 235 in the third direction Z. At least a part of the pad pattern 131 overlaps the second connection pattern 235 in the third direction Z. At least a part of the second connection pattern 235 overlaps the pad pattern 131 in the third direction Z. The second connection pattern 235 completely overlaps the first connection pattern 135 in the third direction Z.

That is, when the pad pattern 131, the first connection pattern 135, and the second connection pattern 235 are used in the light-receiving region APS, the image sensor according to example embodiments may completely shield the electrical signals generated from the outside in the third direction Z. The image sensor according to example embodiments may completely shield the internally generated electrical signals in the third direction Z.

Figure 10:
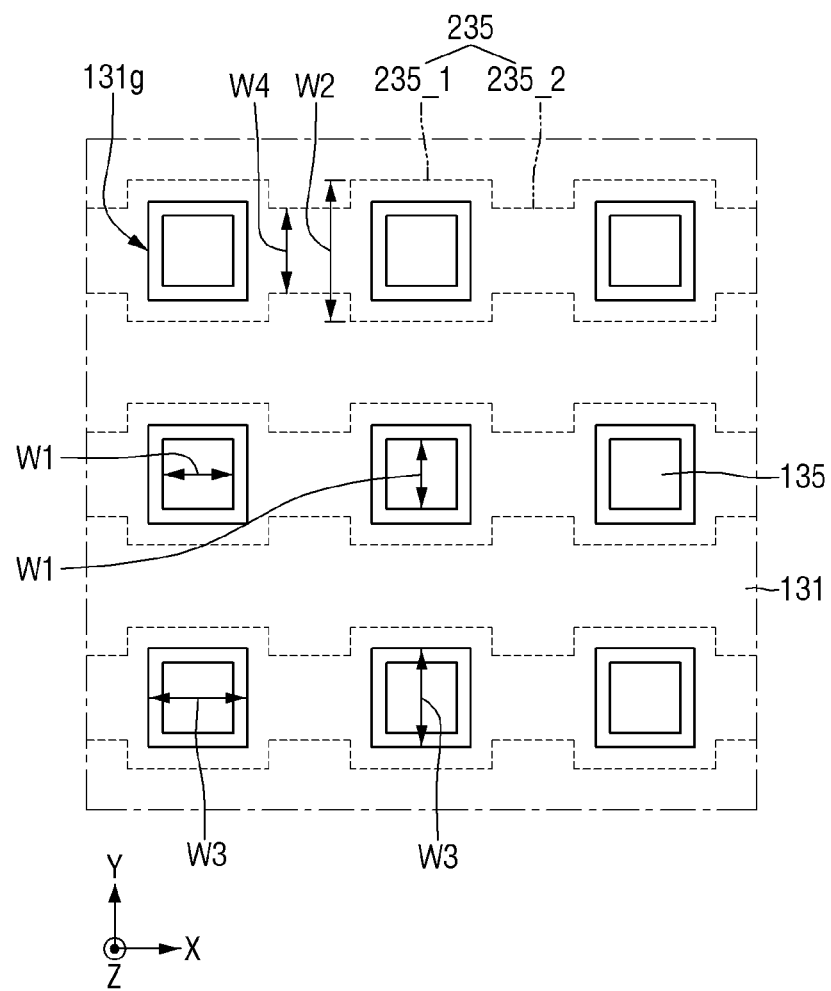
FIG. 10 is a plan view of an image sensor according to example embodiments.

FIG. 10 is a plan view of an image sensor according to example embodiments. For reference, FIG. 10 is a plan view of the pad pattern 131, the first connection pattern 135, and the second connection pattern 235 according to example embodiments. For convenience of explanation, points different from those described using FIGS. 6 to 9 will be mainly described.

Referring to FIG. 10, the width of the second connection pattern 235 in the second direction Y may not be constant.

The second connection pattern 235 may include a plurality of first portions 235_1 and a plurality of second portions 235_2. The first portion 235_1 and the second portion 235_2 may be placed to intersect each other. The second portion 235_2 may be placed between the first portions 235_1. The first portion 235_1 may be placed between the second portions 235_2.

The first portion 235_1 may be a portion that overlaps the grid hole 131g in the third direction Z. The first portion 235_1 may be a portion that overlaps the first connection pattern 135 in the third direction Z. The first portion 235_1 may completely overlap the grid hole 131g and the first connection pattern 135 in the third direction Z. At least a part of the first portion 235_1 may overlap the pad pattern 131 in the third direction Z.

The width of the first portion 235_1 in the second direction Y may be the second width W2. The second width W2 of the first portion 235_1 in the second direction Y is greater than the first width W1 of the first connection pattern 135 in the second direction Y. The second width W2 of the first portion 235_1 in the second direction Y is greater than the third width W3 of the grid hole 131g in the second direction Y.

The second portion 235_2 may be a portion that does not overlap the grid hole 131g and the first connection pattern 135 in the third direction Z. The second portion 235_2 completely overlaps the pad pattern 131 in the third direction Z.

The width of the second portion 235_2 in the second direction Y may be a fourth width W4. The fourth width W4 of the second portion 235_2 in the second direction Y may be smaller than the second width W2 of the first portion 235_1 in the second direction Y. The fourth width W4 may be greater than the first width W1 of the first connection pattern 135 in the second direction Y. The fourth width W4 may be smaller than the third width W3 of the grid hole 131g in the second direction Y. However, example embodiments are not limited thereto, and the fourth width W4 may be smaller than the first width W1. The fourth width W4 may be greater than the third width W3.

Figure 11:
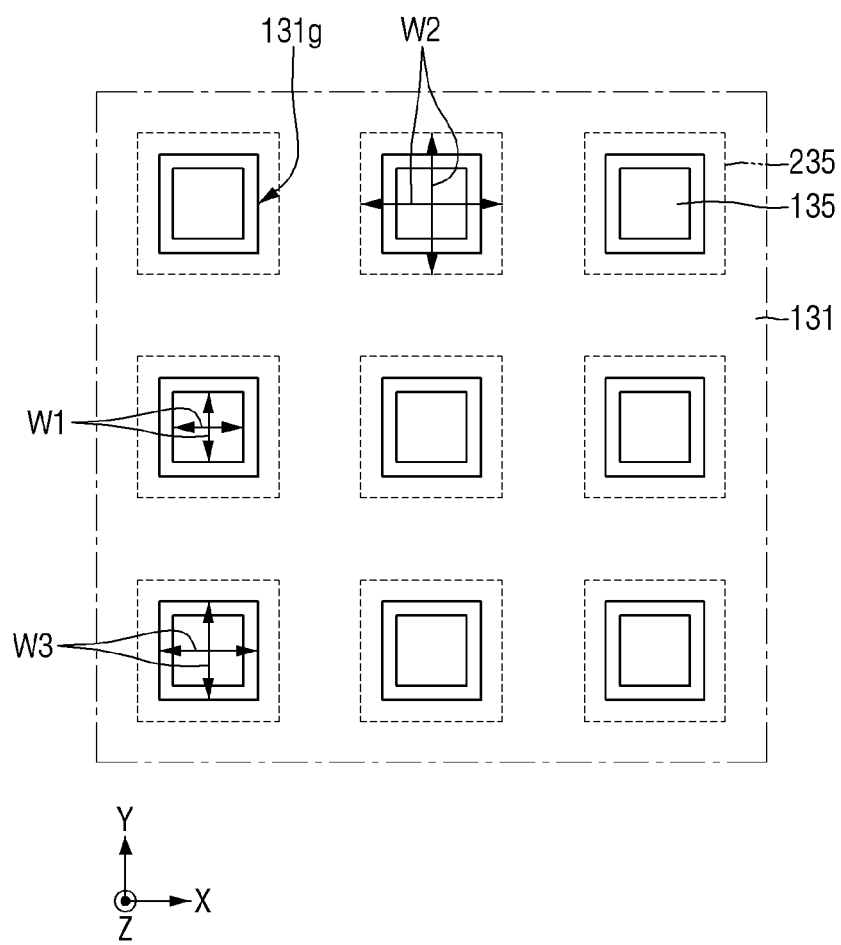
FIG. 11 is a plan view of an image sensor according to example embodiments.

FIG. 11 is a plan view of an image sensor according to example embodiments. For reference, FIG. 11 is a plan view of the pad pattern 131, the first connection pattern 135, and the second connection pattern 235 according to example embodiments. For convenience of explanation, points different from those described using FIGS. 6 to 9 will be mainly described.

Referring to FIG. 11, the second connection pattern 235 may be provided in an island from the planar viewpoint.

The second connection pattern 235 may have a square shape from the planar viewpoint. However, example embodiments are not limited thereto. The second connection pattern 235 may have various shapes such as a rectangle, a circle, an ellipse, a triangle, and a rhombus from the planar viewpoint. Hereinafter, the second connection pattern 235 will be described as having a square shape from the planar viewpoint.

The second connection pattern 235 may have the second width W2 in the first direction X. The second connection pattern 235 may have the second width W2 in the second direction Y. The second width W2 of the second connection pattern 235 in the first direction X is greater than the first width W1 of the first connection pattern 135 in the first direction X. The second width W2 of the second connection pattern 235 in the first direction X is greater than the third width W3 of the grid hole 131g in the first direction X.

The grid holes 131g may completely overlap the second connection pattern 235 in the third direction Z. The first connection pattern 135 may completely overlap the second connection pattern 235 in the third direction Z.

Figure 12:
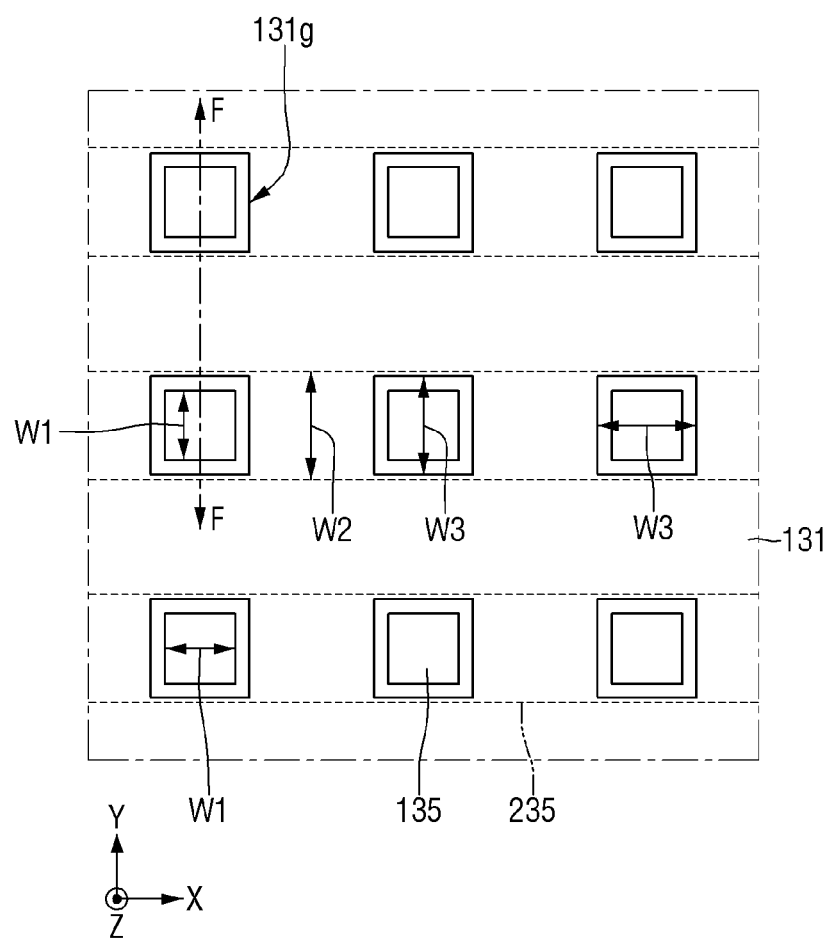
FIG. 12 is a plan view of an image sensor according to example embodiments.
Figure 13:
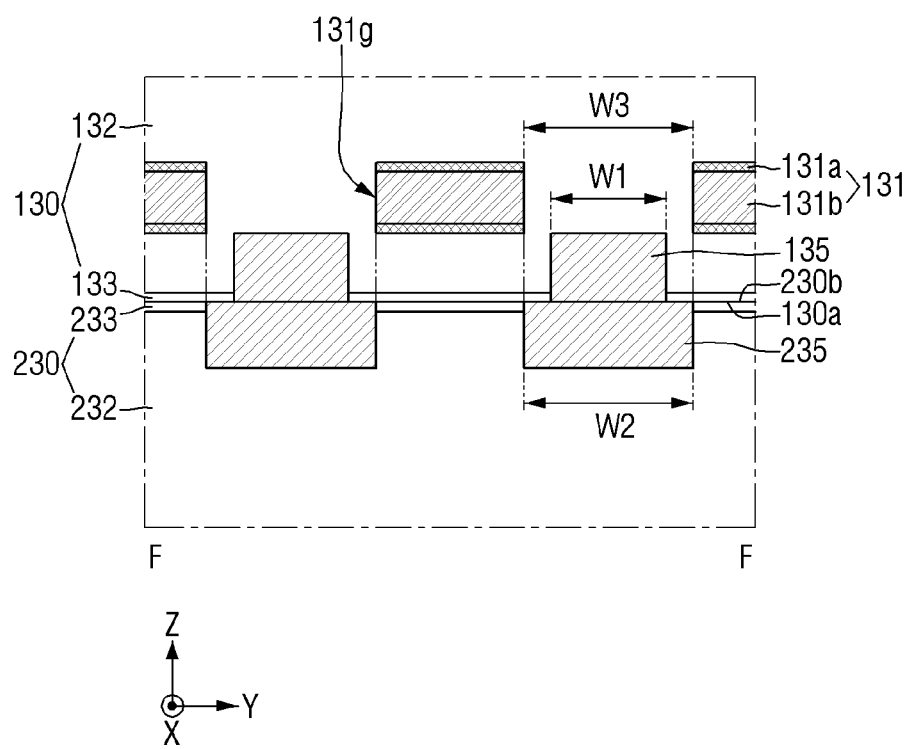
FIG. 13 is a cross-sectional view taken along a line F-F of FIG. 12.

FIG. 12 is a plan view of an image sensor according to example embodiments. FIG. 13 is a cross-sectional view taken along a line F-F of FIG. 12. For reference, FIG. 12 may be a plan view of the pad pattern 131, the first connection pattern 135, and the second connection pattern 235 according to example embodiments. For convenience of explanation, points different from those described using FIGS. 6 to 9 will be mainly described.

Referring to FIGS. 12 and 13, the second width W2 of the second connection pattern 235 in the second direction Y may be the same as the third width W3 of the grid hole 131g in the second direction Y.

In FIG. 12, although the second width W2 is shown as being greater than the third width W3, this is merely for convenience of explanation.

The second connection pattern 235 may completely overlap the grid hole 131g in the third direction Z. The second connection pattern 235 may not overlap the pad pattern 131 in the third direction Z.

Figure 14:
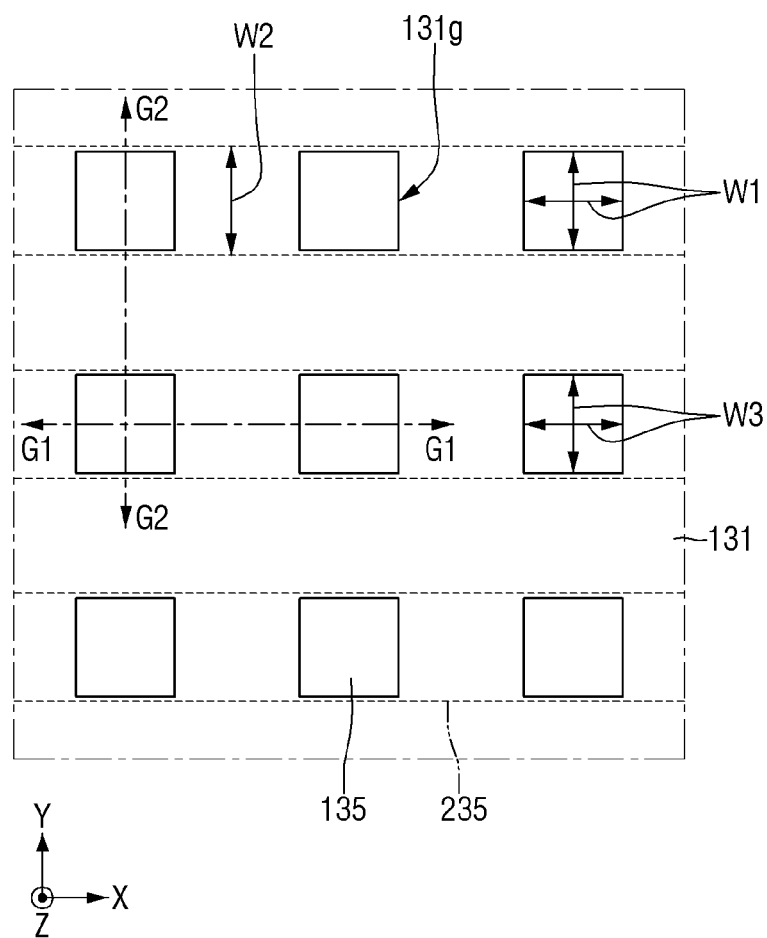
FIG. 14 is a plan view of an image sensor according to example embodiments.
Figure 15:
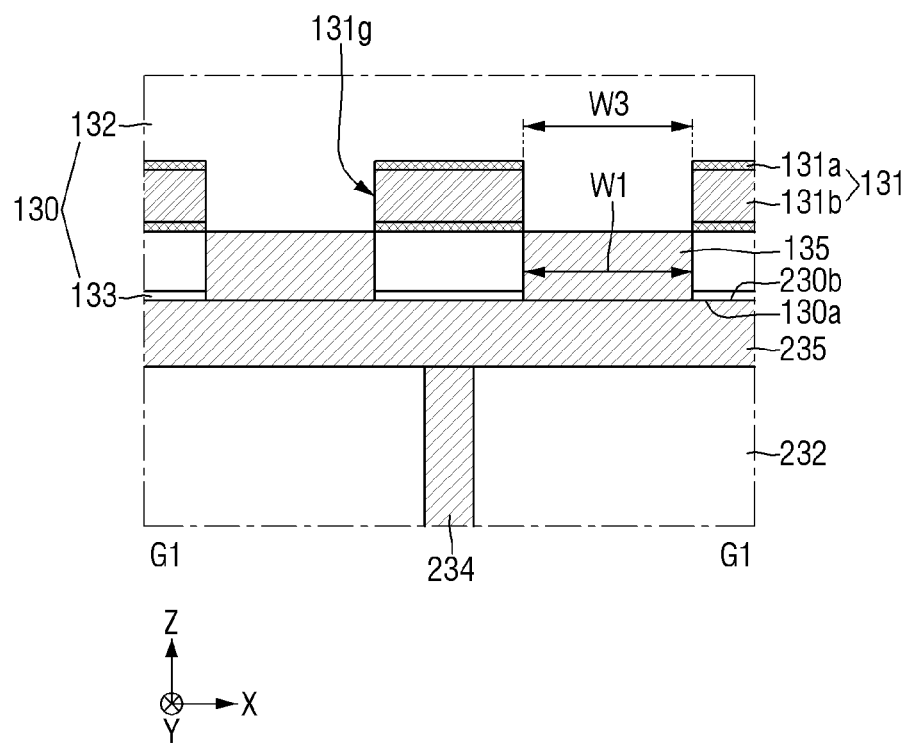
FIG. 15 is a cross-sectional view taken along G1-G1 of FIG. 14.
Figure 16:
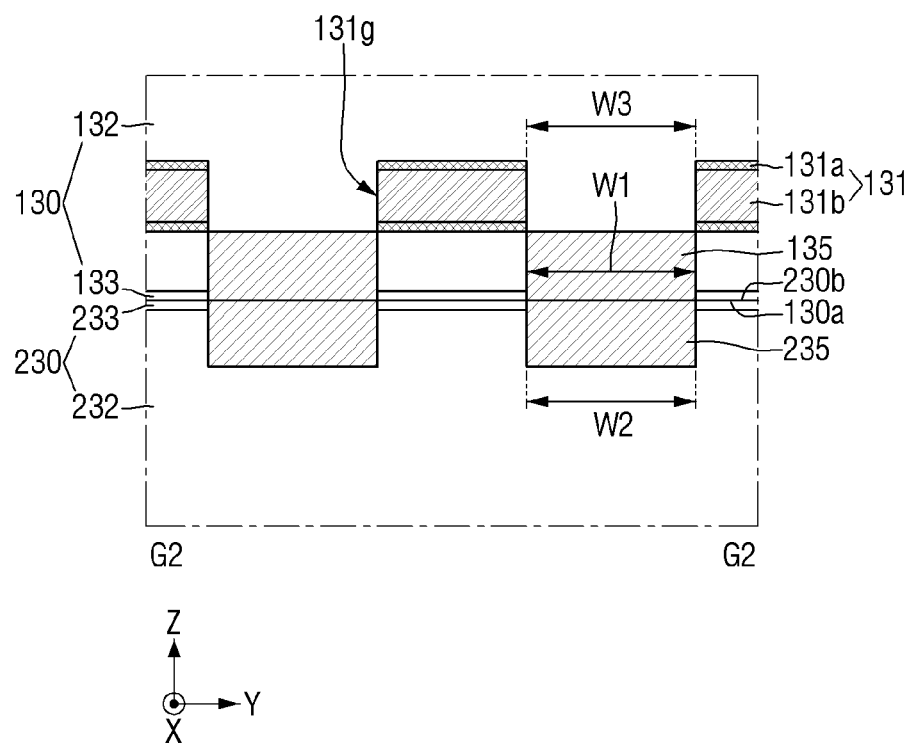
FIG. 16 is a cross-sectional view taken along G2-G2 of FIG. 14.

FIG. 14 is a plan view of an image sensor according to example embodiments. FIG. 15 is a cross-sectional view taken along G1-G1 of FIG. 14. FIG. 16 is a cross-sectional view taken along G2-G2 of FIG. 14. For reference, FIG. 14 may be a plan view of the pad pattern 131, the first connection pattern 135, and the second connection pattern 235 according to example embodiments. For convenience of explanation, points different from those described using FIGS. 6 to 9 will be mainly described.

Referring to FIGS. 14 to 16, the first width W1 of the first connection pattern 135 in the first direction X may be the same as the third width W3 of the grid hole 131g in the first direction X.

The first connection pattern 135 may completely overlap the grid hole 131g in the third direction Z. The first width W1 of the first connection pattern 135 in the second direction Y may be the same as the third width W3 of the grid hole 131g in the second direction Y.

In FIG. 14, although the second width W2 is shown as being greater than the first width W1 and the third width W3, this is merely for convenience of explanation.

The second width W2 of the second connection pattern 235 in the second direction Y may be the same as the first width W1 of the first connection pattern 135 in the second direction Y and the third width W3 of the grid hole 131g in the second direction Y. However, example embodiments are not limited thereto. The first width W1 of the first connection pattern 135 in the second direction Y and the third width W3 of the grid hole 131g in the second direction Y may be greater or smaller than the second width W2 of the second connection pattern 235 in the second direction Y.

When the second width W2 of the second connection pattern 235 in the second direction Y is greater than the third width W3 of the grid hole 131g in the second direction Y, at least a part of the second connection pattern 235 may overlap the pad pattern 131 in the third direction Z. When the second width W2 of the second connection pattern 235 in the second direction Y is smaller than the third width W3 of the grid hole 131g in the second direction Y, the second connection pattern 235 may not overlap the pad pattern 131 in the third direction Z. When the second width W2 of the second connection pattern 235 in the second direction Y is the same as the third width W3 of the grid hole 131g in the second direction Y, the second connection pattern 235 may not overlap the pad pattern 131 in the third direction Z.

Figure 17:
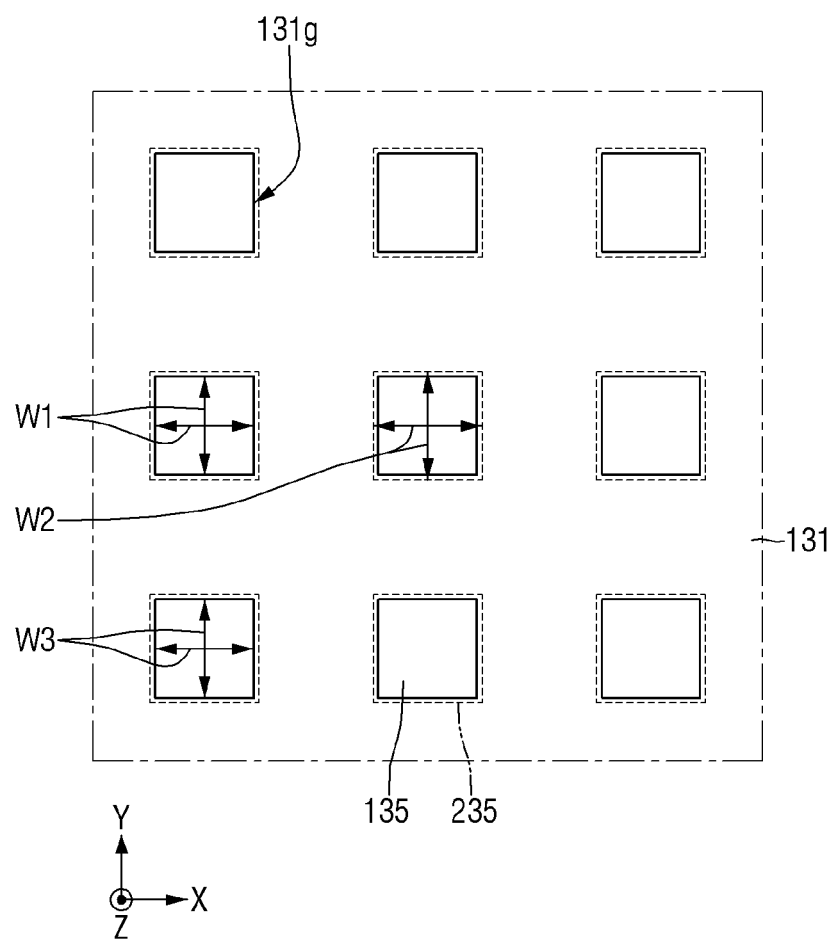
FIG. 17 is a plan view of an image sensor according to example embodiments.

FIG. 17 is a plan view of an image sensor according to example embodiments. For reference, FIG. 17 may be a plan view of the pad pattern 131, the first connection pattern 135, and the second connection pattern 235 according to example embodiments. For convenience of explanation, points different from those described using FIGS. 6 to 9 will be mainly described.

Referring to FIG. 17, the second connection pattern 235 may be provided in an island shape from the planar viewpoint.

The second connection pattern 235 may have a square shape from the planar viewpoint. However, example embodiments are not limited thereto. The second connection pattern 235 may have various shapes such as a rectangle, a circle, an ellipse, a triangle, and a rhombus from the planar viewpoint. Hereinafter, the second connection pattern 235 will be described as having a square shape from the planar viewpoint.

In FIG. 17, although the second width W2 is shown as being greater than the first width W1 and the third width W3, this is for convenience of explanation. The first width W1 of the first connection pattern 135 in the first direction X, the second width W2 of the second connection pattern 235 in the first direction X, and the third width W3 of the grid hole 131g in the first direction X may be identical to each other.

The first width W1 of the first connection pattern 135 in the second direction Y, the second width W2 of the second connection pattern 235 in the second direction Y, and the third width W3 of the grid hole 131g in the second direction Y may be identical to each other.

That is, the first connection pattern 135, the second connection pattern 235, and the grid hole 131g may completely overlap together in the third direction Z.

Figure 18:
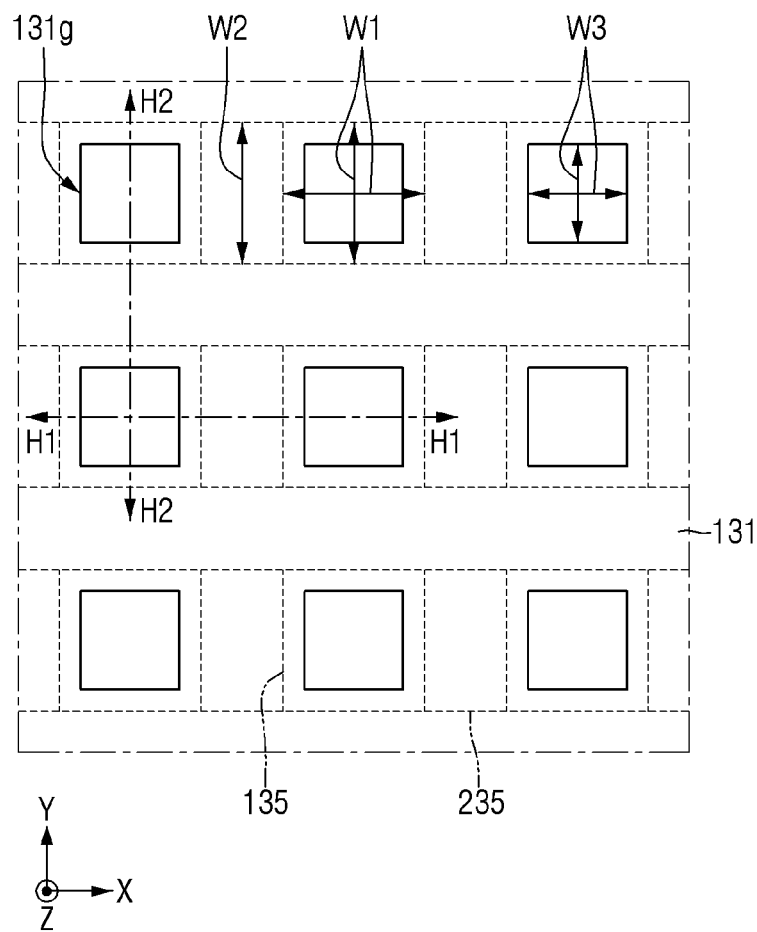
FIG. 18 is a plan view of an image sensor according to example embodiments.
Figure 19:
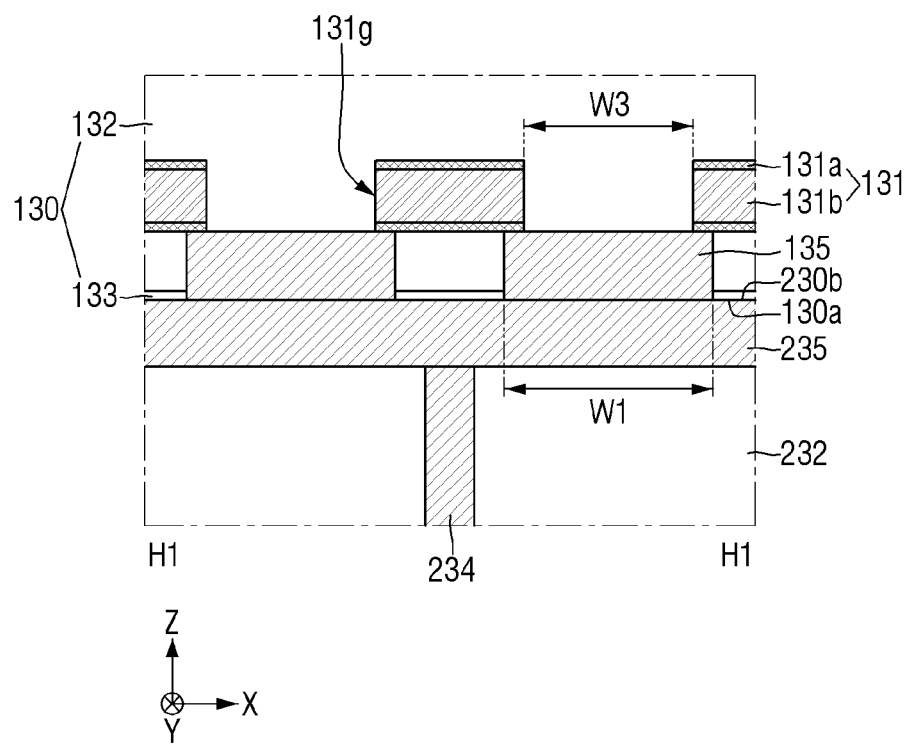
FIG. 19 is a cross-sectional view taken along H1-H1 of FIG. 18.
Figure 20:
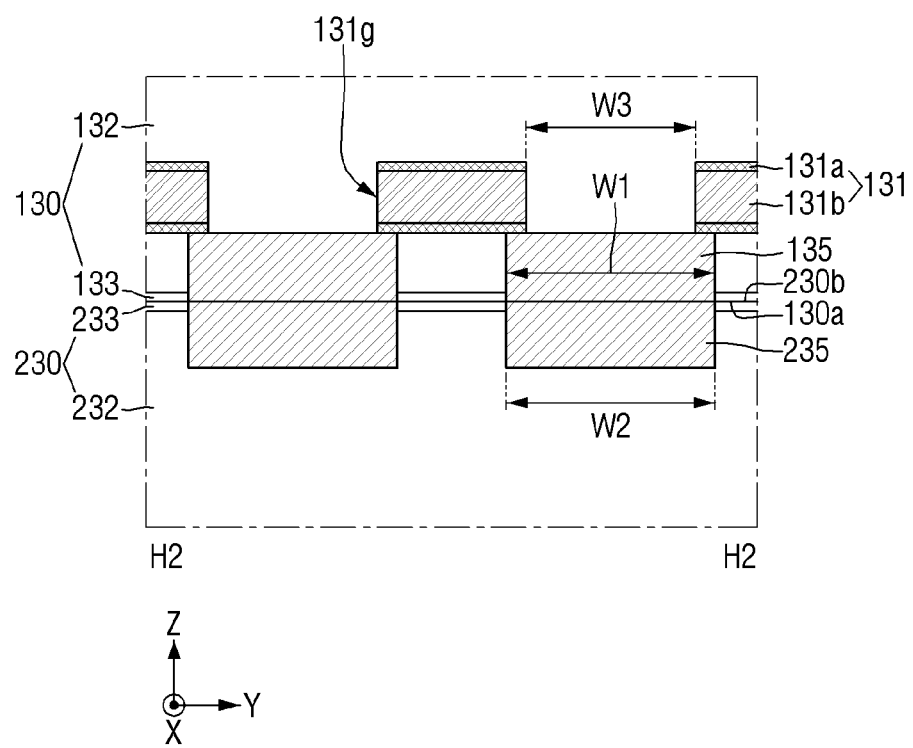
FIG. 20 is a cross-sectional view taken along H2-H2 of FIG. 18.

FIG. 18 is a plan view of an image sensor according to example embodiments. FIG. 19 is a cross-sectional view taken along H1-H1 of FIG. 18. FIG. 20 is a cross-sectional view taken along H2-H2 of FIG. 18. For reference, FIG. 18 may be a plan view of the pad pattern 131, the first connection pattern 135, and the second connection pattern 235 according to example embodiments. For convenience of explanation, points different from those described using FIGS. 6 to 9 will be mainly described.

Referring to FIGS. 18 to 20, the width of the first connection pattern 135 may be greater than the width of the grid holes 131g.

For example, the first width W1 of the first connection pattern 135 in the first direction X may be greater than the third width W3 of the grid hole 131g in the first direction X. The first width W1 of the first connection pattern 135 in the second direction Y may be greater than the third width W3 of the grid hole 131g in the second direction Y.

At least a part of the first connection pattern 135 may overlap the pad pattern 131 in the third direction Z. The grid hole 131g may completely overlap the first connection pattern 135 in the third direction Z.

The second connection pattern 235 may extend in the first direction X. The second width W2 of the second connection pattern 235 in the second direction Y may be the same as the first width W1 of the first connection pattern 135 in the second direction Y. However, example embodiments are not limited thereto. The second width W2 of the second connection pattern 235 in the second direction Y may be greater or smaller than the first width W1 of the first connection pattern 135 in the second direction Y.

Figure 21:
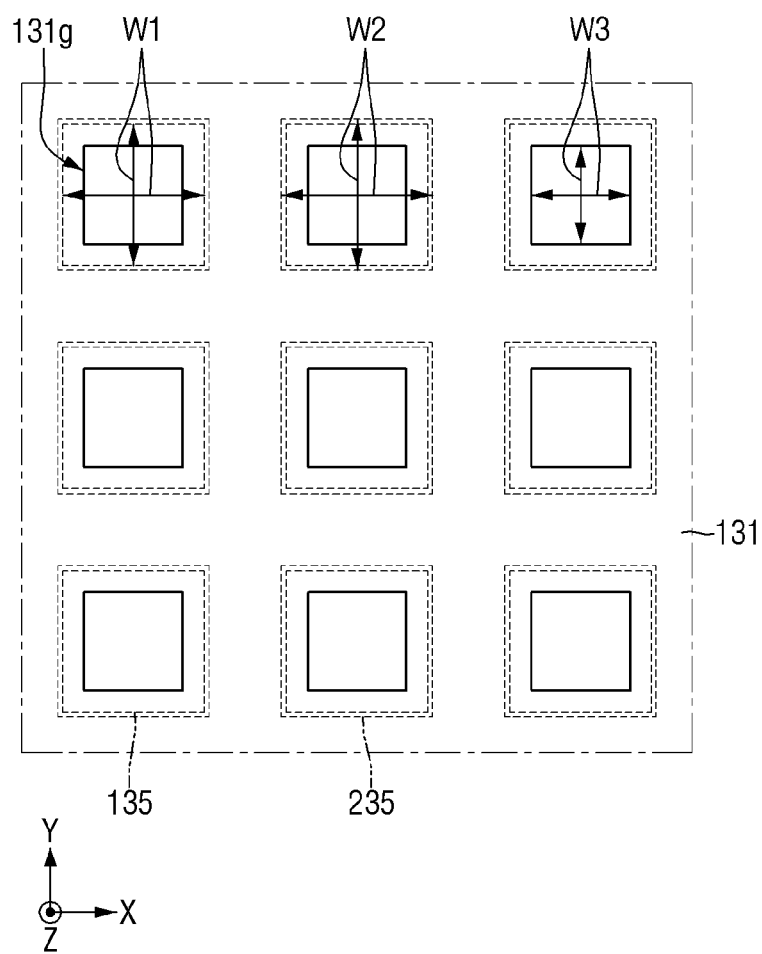
FIG. 21 is a plan view of an image sensor according to example embodiments.

FIG. 21 is a plan view of an image sensor according to example embodiments. For reference, FIG. 21 may be a plan view of the pad pattern 131, the first connection pattern 135, and the second connection pattern 235 according to example embodiments. For convenience of explanation, points different from those described using FIGS. 6 to 9 and 18 to 20 will be mainly described.

Referring to FIG. 21, the second connection pattern 235 may be provided in an island from the planar viewpoint.

The second connection pattern 235 may have a square shape from the planar viewpoint. However, example embodiments are not limited thereto. The second connection pattern 235 may have various shapes such as a rectangle, a circle, an ellipse, a triangle, and a rhombus from the planar viewpoint. Hereinafter, the second connection pattern 235 will be described as having a square shape from the planar viewpoint.

The second connection pattern 235 may have a third width W3 in the first direction X. The second connection pattern 235 may have the third width W3 in the second direction Y.

In FIG. 21, although the second width W2 is shown as being greater than the first width W1, this is merely for convenience of explanation. The second width W2 of the second connection pattern 235 in the first direction X may be the same as the first width W1 of the first connection pattern 135 in the first direction X. The second width W2 of the second connection pattern 235 in the second direction Y may be the same as the first width W1 of the first connection pattern 135 in the second direction Y. That is, the second connection pattern 235 may completely overlap the first connection pattern 135 in the third direction Z. However, example embodiments are not limited thereto.

Figure 22:
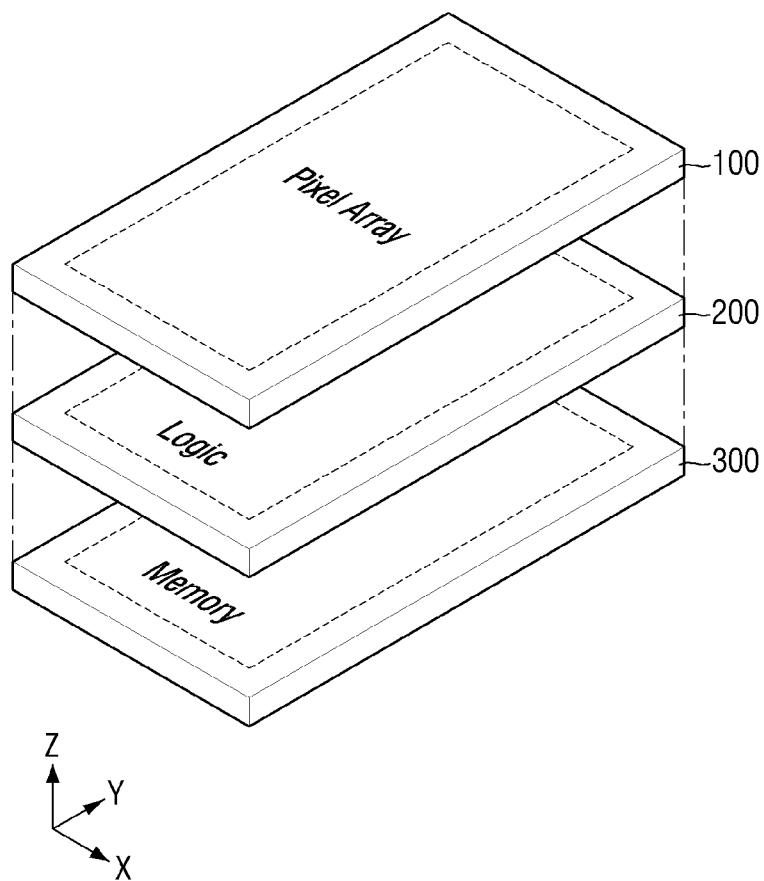
FIG. 22 is a diagram showing a conceptual layout of the image sensor according to example embodiments.

FIG. 22 is a diagram showing a conceptual layout of the image sensor according to example embodiments. For convenience of explanation, points different from those described using FIG. 2 will be mainly described.

The image sensor according to example embodiments may further include a third substrate structure 300. The first substrate structure 100, the second substrate structure 200, and the third substrate structure 300 may be sequentially stacked along the third direction Z. The third substrate structure 300 may be placed below the second substrate structure 200. That is, the second substrate structure 200 may be placed between the first substrate structure 100 and the third substrate structure 300.

The third substrate structure 300 may include a memory device. The third substrate structure 300 may include, for example, a volatile memory device such as a DRAM or an SRAM. The third substrate structure 300 may receive signals from the first substrate structure 100 and the second substrate structure 200 and process the signals through the memory device. That is, the image sensor including the third substrate structure 300 may correspond to a 3-stack image sensor.

FIGS. 23 to 31 are diagrams illustrating a method for fabricating an image sensor according to example embodiments. For reference, FIGS. 23 to 31 may be intermediate diagrams related to the method for fabricating the pad pattern 131, the first connection pattern 135, and the second connection pattern 235 of the image sensor according to example embodiments.

Hereinafter, methods for fabricating an image sensor according to example embodiments will be described referring to FIGS. 23 to 31.

Figure 23:
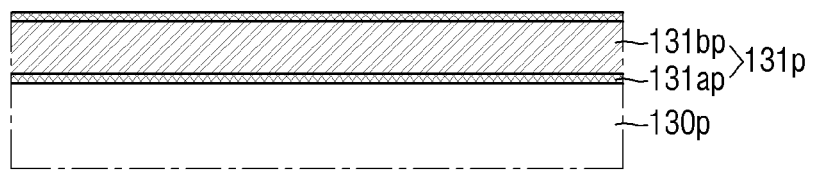
FIGS. 23 to 31 are diagrams illustrating a method for fabricating an image sensor according to example embodiments.
Figure 23:
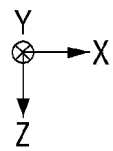

Referring to FIG. 23, a pre pad pattern 131$p$ may be formed on a pre second inter-wiring insulating film 130$p$.

The pre pad pattern 131$p$ may include pre pad pattern liner films 13 lap and a pre pad pattern filling film 131$bp$. The pre pad pattern liner films 131$ap$ may be formed on opposite sides of the pre pad pattern filling film 131$bp$ to form the pre second inter-wiring insulating film 130$p$. The pre pad pattern filling film 131$bp$ may be formed on and below the pre pad pattern liner film 131$a$ p. The pre pad pattern liner film 131$ap$ may be formed on two sides of the pre pad pattern filling film 131$bp$.

The pre pad pattern liner film 131$ap$ may include, for example, titanium nitride (TiN). The pre pad pattern filling film 131$bp$ may include, for example aluminum (Al). However, example embodiments are not limited th$p$ may include, for example, but is not limited to, at least one of silicon oxide, silicon nitride, silicon oxynitride, and a low dielectric constant (low-k) substance having a lower dielectric constant than silicon oxide.

Figure 24:
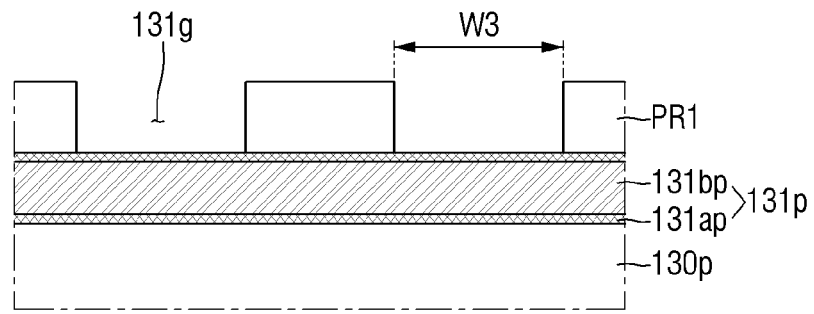
Figure 24:
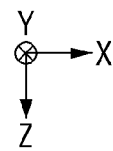

Referring to FIG. 24, first photosensitive films PR1 may be formed on the pre pad pattern 131$p$.

The first photosensitive films PR1 may be used as masks for forming a pad pattern. The first photosensitive films PR1 may be spaced apart from each other. The spaced distance of the first photosensitive films PR1 may be the third width W3.

Figure 25:
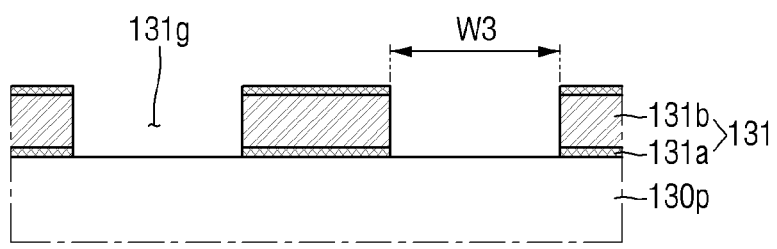
Figure 25:
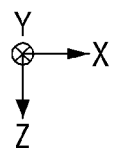

Referring to FIG. 25, a part of the pre pad pattern 131$p$ may be etched to form the pad pattern 131.

A part of the pre pad pattern 131$p$ may be etched to form the grid hole 131$g$. The grid hole 131$g$ may have an island shape from the planar viewpoint.

The pad patterns 131 may be formed to expose the pre second inter-wiring insulating film 130p. The pad patterns 131 may be spaced apart from each other by the third width W3. The width of the grid hole 131$g$ may be the third width W3.

Subsequently, the first photosensitive film PR1 may be removed.

Figure 26:
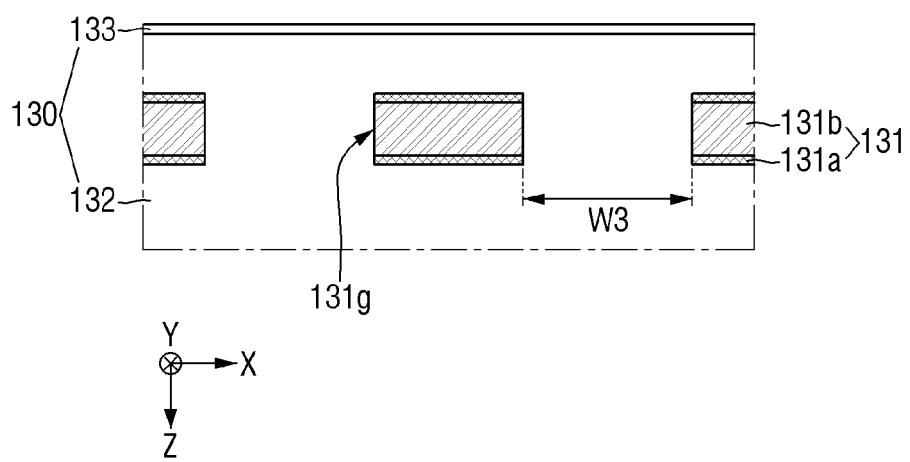
Figure 26:
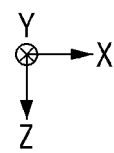

Referring to FIG. 26, the second inter-wiring insulating film 130 may be formed on the pad pattern 131.

The second inter-wiring insulating film 130 may include a first interlayer insulating film 132 and a first bonding insulating film 133.

First, the first interlayer insulating film 132 that fills the grid hole 131$g$ and covers the pad pattern 131 may be formed. The first bonding insulating film 133 may be formed on the first interlayer insulating film 132. The pad pattern 131 may be buried inside the first interlayer insulating film 132.

Figure 27:
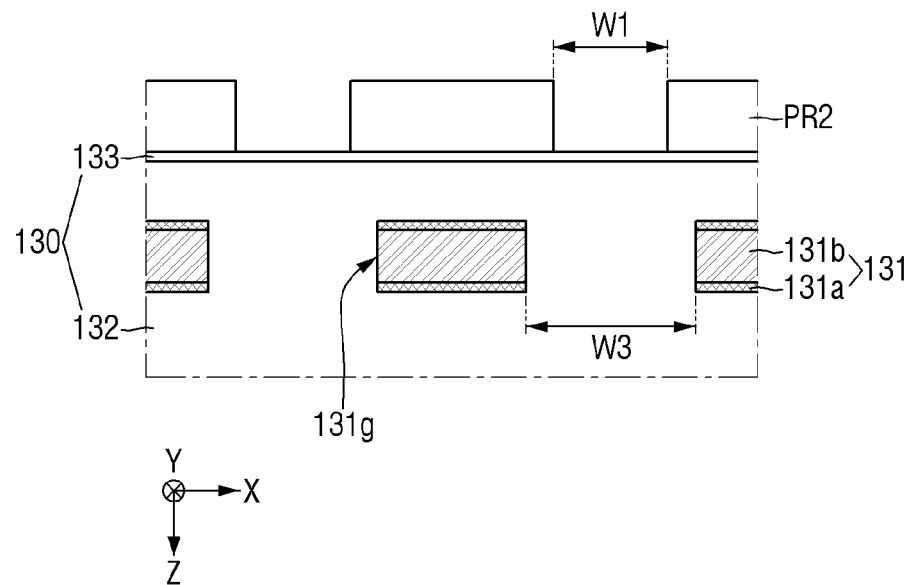

Referring to FIG. 27, second photosensitive films PR2 may be formed on the first bonding insulating film 133.

The second photosensitive films PR2 may be used, for example, as masks for forming the first connection pattern.

The second photosensitive films PR2 may be spaced apart from each other. The second photosensitive films PR2 may be spaced apart from each other by the first width W1.

The first width W1 by which the second photosensitive films PR2 are spaced may be smaller than the third width W3 of the grid hole 131$g$. However, example embodiments are not limited thereto.

Figure 28:
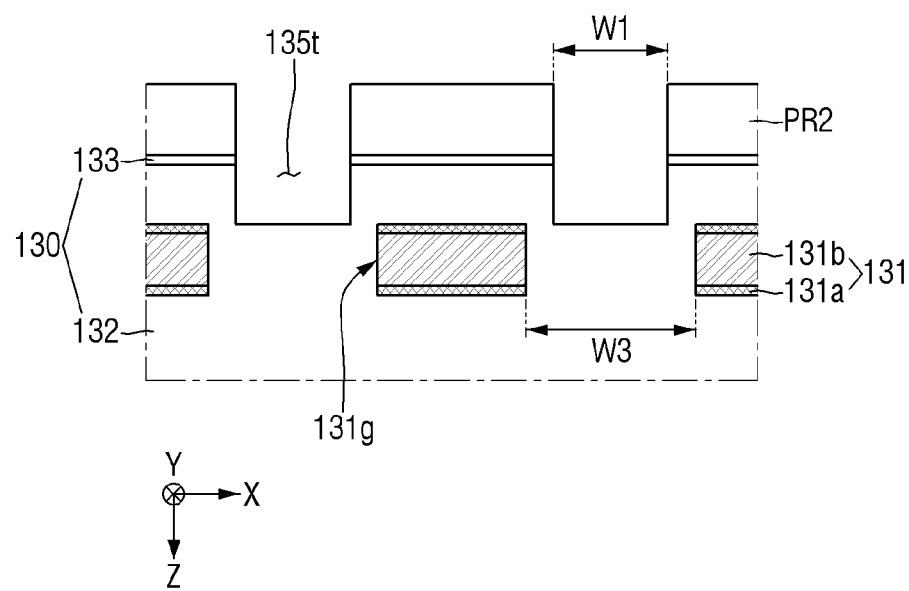

Referring to FIG. 28, example parts of the first bonding insulating film 133 and the first interlayer insulating film 132 may be etched to form a first connection pattern trench 135$t$.

A bottom surface of the first connection pattern trench 135$t$ may be on the same plane as the upper surface of the pad pattern 131. The first width W1 of the first connection pattern trench 135$t$ may be smaller than the third width W3 of the grid hole 131$g$. That is, the first interlayer insulating film 132 may be provided between the first connection pattern trench 135$t$ and the pad pattern 131, and the first connection pattern trench 135$t$ may not be in contact with the pad pattern 131.

Figure 29:
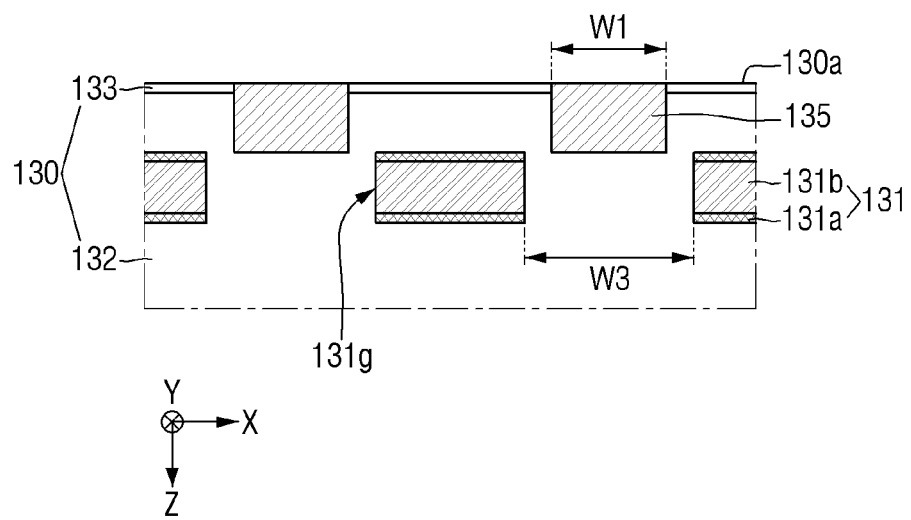

Referring to FIG. 29, a first connection pattern 135 that fills the first connection pattern trench 135$t$ may be formed. The second photosensitive films PR2 may be removed.

The upper surface of the first connection pattern 135 may be placed on the same plane as the upper surface 130$a$ of the second inter-wiring insulating film 130. The upper surface of the first connection pattern 135 may be on the same plane as the upper surface of the first bonding insulating film 133.

The first connection pattern 135 may have a first width W1. A lower surface of the first connection pattern 135 may be on the same plane as the upper surface of the pad pattern 131. That is, the first connection pattern 135 may not be in contact with the pad pattern 131.

Figure 30:
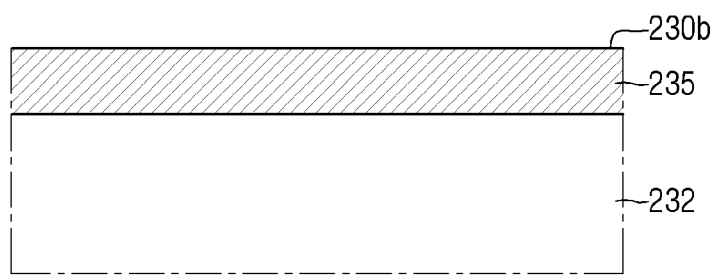

Referring to FIG. 30, a second connection pattern 235 may be on the second interlayer insulating film 232. The second connection pattern 235 may extend in the first direction (e.g., the first direction X shown in FIG. 8). The lower surface of the second connection pattern 235 may be the lower surface 230$b$ of the third inter-wiring insulating film (e.g., 230 of FIG. 9).

Figure 31:
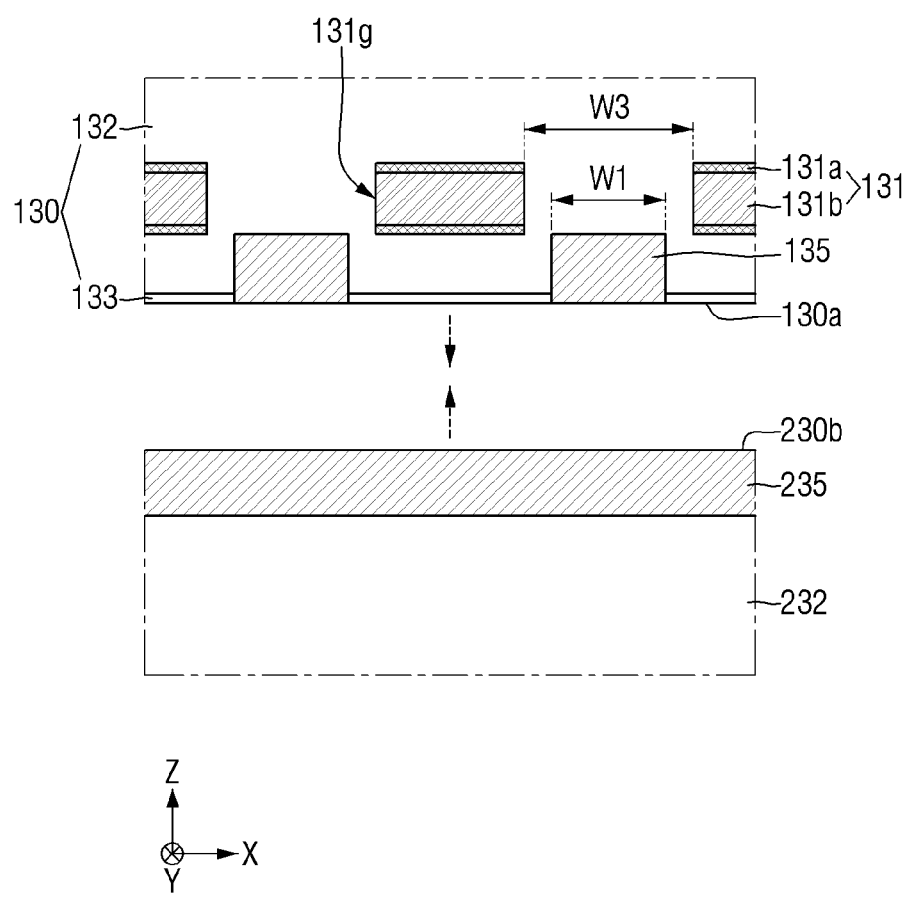

Referring to FIG. 31, the upper surface 130$a$ of the second inter-wiring insulating film 130 and the lower surface 230$b$ of the third inter-wiring insulating film 230 may be bonded to each other.

While example embodiments have been shown and described, it will be understood that various changes in form and details may be made therein without departing from the spirit and scope of the following claims.

What is claimed is:

1. An image sensor comprising:
   a substrate which has a first surface and a second surface that are opposite to each other;
   a plurality of unit pixels, each of which comprises a photoelectric conversion layer, inside the substrate;
   a pixel separation pattern provided between the plurality of the unit pixels, inside the substrate;
   a first inter-wiring insulating film provided on the first surface of the substrate;
   a pad pattern provided inside the first inter-wiring insulating film;
   a first connection pattern provided inside the first inter-wiring insulating film, an upper surface of the first connection pattern and an upper surface of the first inter-wiring insulating film being provided along a first common plane;
   a second inter-wiring insulating film provided on the upper surface of the first inter-wiring insulating film;

a second connection pattern provided inside the second inter-wiring insulating film, a lower surface of the second connection pattern and a lower surface of the second inter-wiring insulating film being provided along a second common plane; and a microlens provided on the second surface of the substrate, wherein the first connection pattern comprises a plurality of portions, each of which has an island shape from a planar viewpoint, the pad pattern is provided in a grid shape defining a plurality of grid holes, the plurality of grid holes respectively corresponding to the plurality of portions of the first connection pattern, the first connection pattern does not overlap the pad pattern in a first direction perpendicular to the first surface of the substrate, and the second connection pattern overlaps the pad pattern in the first direction.

2. The image sensor of claim 1, wherein the second connection pattern extends in a second direction that intersects the first direction.

3. The image sensor of claim 2, wherein a width of the second connection pattern is constant in a third direction intersecting the first direction and the second direction.

4. The image sensor of claim 2, wherein the width of the second connection pattern in a third direction is greater than a width of the first connection pattern in the third direction, and the third direction intersects the first direction and the second direction.

5. The image sensor of claim 2, wherein the second connection pattern comprises a plurality of first portions, and a plurality of second portions located between the plurality of first portions, a width of the plurality of first portions in a third direction is greater than a width of the plurality of second portions in the third direction the plurality of first portions overlap the first connection pattern in the first direction, and the third direction intersects the first direction and the second direction.

6. The image sensor of claim 1, wherein the second connection pattern is provided in the island shape from the planar viewpoint.

7. The image sensor of claim 1, wherein the second connection pattern does not overlap the first connection pattern in the first direction.

8. The image sensor of claim 1, wherein the first connection pattern is not in contact with the pad pattern.

9. The image sensor of claim 1, wherein the pad pattern, the first connection pattern, and the second connection pattern are electrically connected to each other.

10. The image sensor of claim 1, further comprising:
a wiring pattern which is provided on the first surface of the substrate and connected to the pad pattern; and
a contact which connects the wiring pattern and the pixel separation pattern.

11. An image sensor comprising:
a substrate which has a first surface and a second surface that are opposite to each other, a first region, and a second region around the first region;
a plurality of unit pixels, each of which comprises a photoelectric conversion layer, inside the substrate;
a pixel separation pattern provided between the plurality of unit pixels, inside the substrate;
a first inter-wiring insulating film provided on the first surface of the substrate;
a pad pattern provided in a grid shape defining a plurality of grid holes from a planar viewpoint, inside the first inter-wiring insulating film, in the first region;
a first connection pattern which is provided inside the first inter-wiring insulating film, an upper surface of the first connection pattern and an upper surface of the first inter-wiring insulating film being provided along a first common plane, the first connection pattern comprising portions respectively corresponding to the plurality of grid holes;
a second inter-wiring insulating film provided on the upper surface of the first inter-wiring insulating film;
a second connection pattern which is provided inside the second inter-wiring insulating film, a lower surface of the second connection pattern and a lower surface of the second inter-wiring insulating film being provided along a second common plane; and
a microlens provided on the second surface of the substrate, in the first region,
wherein the first connection pattern does not overlap the pad pattern in a first direction perpendicular to the first surface of the substrate, in the first region, and
the second connection pattern overlaps the pad pattern and the first connection pattern in the first direction, in the first region.

12. The image sensor of claim 11, wherein each of the portions of the first connection pattern is provided in an island shape from the planar viewpoint.

13. The image sensor of claim 11, wherein the second connection pattern extends in a second direction that intersects the first direction.

14. The image sensor of claim 13, wherein a width of the second connection pattern in a third direction intersecting in the first direction and the second direction is greater than a width of the first connection pattern in the third direction.

15. The image sensor of claim 11, wherein the second connection pattern is provided in an island shape from the planar viewpoint.

16. The image sensor of claim 11, wherein at least a portion of the second connection pattern does not overlap the first connection pattern in the first direction.

17. An image sensor comprising:
a substrate which has a first surface and a second surface that are opposite to each other;
a plurality of unit pixels, each of which includes a photoelectric conversion layer, inside the substrate;
a pixel separation pattern provided between the plurality of the unit pixels, inside the substrate;
a first inter-wiring insulating film which is provided on the first surface of the substrate, and comprises a first bonding insulating film which defines an upper surface of the first inter-wiring insulating film;
a pad pattern provided in a grid shape defining a plurality of grid holes from a planar viewpoint, inside the first inter-wiring insulating film;
a first connection pattern which comprises a plurality of portions, each of which has an island shape from the planar viewpoint, wherein the first connection pattern is provided inside the first inter- wiring insulating film and penetrates the first bonding insulating film, and an upper surface of the first connection pattern and the upper surface of the first inter-wiring insulating film are provided along a first common plane;
a second inter-wiring insulating film which is provided on the upper surface of the first inter- wiring insulating film, and comprises a second bonding insulating film that defines a lower surface of the second inter-wiring insulating film;

a second connection pattern which is provided inside the second inter-wiring insulating film and penetrates the second bonding insulating film, a lower surface of the second connection pattern and the lower surface of the second inter-wiring insulating film being provided along a second common plane; and a microlens provided on the second surface of the substrate, wherein the first connection pattern and the pad pattern do not overlap in a first direction perpendicular to the first surface of the substrate, the second connection pattern overlaps the pad pattern in the first direction and extends in a second direction that intersects the first direction, and the upper surface of the first inter-wiring insulating film and the lower surface of the second inter-wiring insulating film are in contact with each other.

18. The image sensor of claim 17, wherein a width of the first connection pattern in a third direction intersecting the first direction and the second direction is smaller than a width of the second connection pattern in the third direction.

* * * * *